US012656685B2

(12) United States Patent
Shibayama et al.

(10) Patent No.: US 12,656,685 B2
(45) Date of Patent: Jun. 16, 2026

(54) FILM FORMING COMPOSITION

(71) Applicant: NISSAN CHEMICAL CORPORATION, Tokyo (JP)

(72) Inventors: Wataru Shibayama, Toyama (JP); Yutaro Kuramoto, Toyama (JP); Satoshi Takeda, Toyama (JP); Shuhei Shigaki, Toyama (JP); Ken Ishibashi, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 778 days.

(21) Appl. No.: 17/419,105

(22) PCT Filed: Dec. 25, 2019

(86) PCT No.: PCT/JP2019/050871

§ 371 (c)(1),
(2) Date: Sep. 29, 2021

(87) PCT Pub. No.: WO2020/138189

PCT Pub. Date: Jul. 2, 2020

(65) Prior Publication Data

US 2022/0100092 A1 Mar. 31, 2022

(30) Foreign Application Priority Data

Dec. 27, 2018 (JP) ................................ 2018-246260

(51) Int. Cl.

*G03F 7/075* (2006.01)
*C07F 7/10* (2006.01)
*G03F 7/11* (2006.01)
*G03F 7/20* (2006.01)

(52) U.S. Cl.

CPC .............. *G03F 7/0752* (2013.01); *C07F 7/10* (2013.01); *G03F 7/11* (2013.01); *G03F 7/2004* (2013.01)

(58) Field of Classification Search

CPC ........ G03F 7/11; G03F 7/0752; G03F 7/0755; C07F 7/10; C07F 7/0838; C07F 7/08; C08G 77/22; C09D 183/06; C09D 183/08

See application file for complete search history.

(56) References Cited

U.S. PATENT DOCUMENTS

| | | | | |
|---|---|---|---|---|
| 2011/0287369 | A1* | 11/2011 | Shibayama | C08L 83/04 252/582 |
| 2012/0178261 | A1* | 7/2012 | Kanno | G03F 7/0751 257/E21.249 |
| 2013/0280912 | A1 | 10/2013 | Ogihara et al. | |
| 2015/0126700 | A1 | 5/2015 | Kamuro et al. | |
| 2016/0096977 | A1* | 4/2016 | Tachibana | H01L 21/02126 257/618 |
| 2019/0339618 | A1 | 11/2019 | Shigaki et al. | |

FOREIGN PATENT DOCUMENTS

| | | | |
|---|---|---|---|
| CN | 104321385 | A | 1/2015 |
| JP | 2008308541 | A | * 12/2008 |
| JP | 2013-224279 | A | 10/2013 |
| JP | 2016-074772 | A | 5/2016 |
| WO | 2010/021290 | A1 | 2/2010 |
| WO | 2010/071155 | A1 | 6/2010 |
| WO | 2017/145809 | A1 | 8/2017 |
| WO | 2018/230382 | A1 | 12/2018 |

OTHER PUBLICATIONS

English Machine Translation of JP2008308541A (Year: 2008).*

"Etching Characteristics of Polysiloxane and Application to Multilayer Resist Processes", Hideo Namatsu and Akira Yoshikawa 1986 J. Electrochem. Soc. 133 (Year: 1986).*

Jan. 13, 2023 Office Action issued in Chinese Patent Application No. 201980086354.3.

Aug. 10, 2022 Office Action issued in Chinese Patent Application No. 201980086354.3.

Jun. 2, 2023 Taiwanese Office Action issued in Taiwanese Patent Application No. 108147720.

Mar. 17, 2020 International Search Report issued in International Patent Application No. PCT/JP2019/050871.

Mar. 17, 2020 Written Opinion issued in International Patent Application No. PCT/JP2019/050871.

Jun. 6, 2023 Office Action Issued in Chinese Patent Application No. 201980086354.3.

Nov. 15, 2023 Office Action issued in Taiwanese Patent Application No. 108147720.

Jan. 17, 2024 Office Action issued in Japanese Patent Application No. 2020-563356.

* cited by examiner

*Primary Examiner* — Jonathan Johnson
*Assistant Examiner* — Alexander N. Lee
(74) *Attorney, Agent, or Firm* — Oliff PLC

(57) ABSTRACT

A film-forming composition is suitable as a resist underlayer film-forming composition capable of forming an Si-containing resist underlayer film that exhibits favorable adhesion to an EUV resist and favorable etching processability because of high rate of etching with fluorine. A film-forming composition, for example, including a polymer of Formula (E1) and a solvent.

(E1)

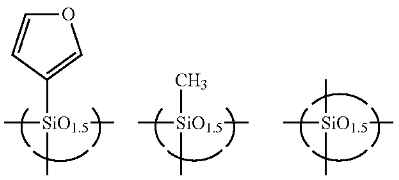

11 Claims, No Drawings

FILM FORMING COMPOSITION

TECHNICAL FIELD

The present invention relates to a film-forming composition.

BACKGROUND ART

Fine processing by lithography using photoresists has been conventionally performed in the production of semiconductor devices. The fine processing is a processing method involving formation of a photoresist thin film on a semiconductor substrate (e.g., a silicon wafer); irradiation of the thin film with active rays (e.g., ultraviolet rays) through a mask pattern having a semiconductor device pattern drawn thereon; development of the irradiated thin film; and etching of the substrate with the resultant photoresist pattern serving as a protective film, to thereby form, on the surface of the substrate, fine irregularities corresponding to the pattern.

In recent years, resist films have been significantly thinned in state-of-the-art semiconductor devices. In particular, a tri-layer (including a resist layer, an Si-containing resist underlayer film, and an organic underlayer film) process requires lithographic properties of the resist on the Si-containing resist underlayer film, as well as high etching rate. In particular, an EUV (extreme ultraviolet) lithography requires introduction of a large amount of a functional group exhibiting high adhesion to a resist for improving lithographic properties, and addition of a large amount of a photoacid generator for improving resolution. However, an increase in the amount of an organic component accompanied with the above introduction and addition causes a serious problem in terms of a reduction in etching rate.

Under such circumstances, there have been reported a resist underlayer film-forming composition containing a silane compound having an onium group, and a resist underlayer film containing a silane compound having an anionic group (Patent Documents 1 and 2).

In recent years, miniaturization of resist has been pronounced in state-of-the-art semiconductor devices. In particular, the aforementioned tri-layer process requires the superior lithographic properties and high etching rate of a silicon hard mask for a resist underlayer film. In particular, the EUV generation process requires introduction of a large amount of a functional group exhibiting high adhesion to a resist for improving lithographic properties (particularly for preventing pattern collapse).

PRIOR ART DOCUMENTS

Patent Documents

Patent Document 1: International Publication WO 2010-021290

Patent Document 2: International Publication WO 2010-071155

SUMMARY OF THE INVENTION

Problems to be Solved by the Invention

In view of the above-described circumstances, an object of the present invention is to provide a film-forming composition suitable as a resist underlayer film-forming composition capable of forming a resist underlayer film that exhibits favorable adhesion to an EUV resist and favorable etching processability because of high rate of etching with fluorine.

Means for Solving the Problems

The present inventors have conducted extensive studies for achieving the aforementioned object, and as a result have found that a thin film exhibiting favorable adhesion to an EUV resist and favorable etching processability (because of high rate of etching with fluorine) can be formed from a film-forming composition containing at least one selected from a hydrolyzable silane having a specific organic group containing a furan ring and/or a thiophene ring, a hydrolysate of the silane, and a hydrolysis condensate of the silane, and a solvent. The present invention has been accomplished on the basis of this finding.

Accordingly, the present invention provides the following.

1. A film-forming composition comprising at least one selected from a hydrolyzable silane, a hydrolysate of the hydrolyzable silane, and a hydrolysis condensate of the hydrolyzable silane, and a solvent, the film-forming composition being characterized in that:

the hydrolyzable silane contains a hetero-ring-containing silane of the following Formula (1):

$$R^1R^2_aSi(R^3)_{3-a} \quad (1)$$

(wherein $R^1$ is an organic group containing a furan ring and/or a thiophene ring;

$R^2$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group;

$R^3$ is a group or atom bonded to a silicon atom, and is each independently an alkoxy group, an aralkyloxy group, an acyloxy group, or a halogen atom;

the organic group containing a furan ring and/or a thiophene ring of $R^1$ and the alkoxy group, aralkyloxy group, or acyloxy group of $R^3$ are optionally bonded together to form a ring; and a is an integer of 0 to 2).

2. The film-forming composition according to 1, wherein the organic group containing a furan ring and/or a thiophene ring is an organic group of the following Formula (K):

(K)

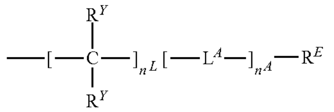

[wherein $n^L$ is an integer of 0 to 10;

$n^A$ is an integer of 0 to 5;

$R^Y$ is each independently a hydrogen atom, a methyl group, an ethyl group, a nitro group, a cyano group, a hydroxy group, a thiol group, a furan-ring-containing group, or a thiophene-ring-containing group, and ($n^L$×2) $R^Y$s are optionally identical to or different from one another;

$R^E$ is a hydrogen atom, a methyl group, an ethyl group, a nitro group, a cyano group, a hydroxy group, a thiol group, a furan-ring-containing group, or a thiophene-ring-containing group;

$L^A$ is each independently a divalent group of any of the following Formulae (L1), (L2), (L3), (L4), (L5), (L6a), (L6b), (L7), (L8), (L9a), (L9b), and (L10):

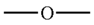
(L1)

(L2)

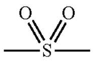
(L3)

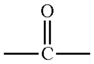
(L4)

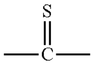
(L5)

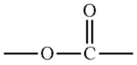
(L6a)

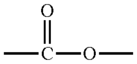
(L6b)

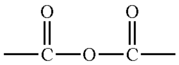
(L7)

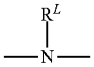
(L8)

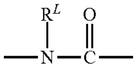
(L9a)

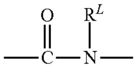
(L9b)

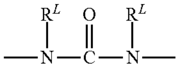
(L10)

(wherein $R^L$ is each independently a hydrogen atom, an alkyl group, or an aryl group);

when $n^L$ is 0, $n^A$ is 0, and $R^E$ is a furan-ring-containing group or a thiophene-ring-containing group; when $n^L$ is 1 or more, at least one of ($n^L$×2) $R^Y$s and $R^E$ is a furan-ring-containing group or a thiophene-ring-containing group; and when a plurality of -$L^A$- groups are present, the -$L^A$- groups are not bonded together].

3. The film-forming composition according to 1 or 2, wherein the composition comprises a hydrolysis condensate of the hydrolyzable silane.

4. The film-forming composition according to any of 1 to 3, wherein the hydrolyzable silane contains the hetero-ring-containing silane of Formula (1), and at least one selected from an additional silane of the following Formula (2) and an additional silane of the following Formula (3):

$$R^{11}{}_{b}Si(R^{12})_{4-b} \quad (2)$$

$$[R^{21}{}_{c}Si(R^{22})_{3-c}]_2Y \quad (3)$$

(in Formula (2), $R^{11}$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group;

$R^{12}$ is a group or atom bonded to a silicon atom, and is each independently an alkoxy group, an aralkyloxy group, an acyloxy group, or a halogen atom; and b is an integer of 0 to 3; and in Formula (3), $R^{21}$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group;

$R^{22}$ is a group or atom bonded to a silicon atom, and is each independently an alkoxy group, an aralkyloxy group, an acyloxy group, or a halogen atom;

Y is a group bonded to a silicon atom, and is each independently an alkylene group or an arylene group; and c is each independently an integer of 0 to 2).

5. The film-forming composition according to 4, wherein the hydrolyzable silane contains the hetero-ring-containing silane of Formula (1) and the additional silane of Formula (2).

6. The film-forming composition according to any one of 1 to 5, wherein the hydrolyzable silane further contains a hydrolyzable organosilane having an onium group in its molecule.

7. The film-forming composition according to any of 1 to 6, wherein the solvent contains water.

8. The film-forming composition according to any of 1 to 7, wherein the composition further comprises a pH adjuster.

9. The film-forming composition according to any of 1 to 8, wherein the composition is for forming a resist underlayer film.

10. An Si-containing resist underlayer film formed from the film-forming composition according to any of 1 to 9.

11. A semiconductor processing substrate comprising a semiconductor substrate and the Si-containing resist underlayer film according to 10.

12. A method for producing a semiconductor device, the method comprising:

a step of forming, on a semiconductor substrate, an Si-containing resist underlayer film from the film-forming composition according to any of 1 to 9;

a step of forming a resist film on the Si-containing resist underlayer film;

a step of exposing the resist film to light;

a step of developing the resist film after the light exposure, to thereby form a resist pattern;

a step of etching the Si-containing resist underlayer film with the resist pattern; and a step of processing the semiconductor substrate with the patterned resist film and Si-containing resist underlayer film.

13. A method for producing a semiconductor device, the method comprising:

a step of forming an organic underlayer film on a semiconductor substrate;

a step of forming, on the organic underlayer film, an Si-containing resist underlayer film from the film-forming composition according to any of 1 to 9;

a step of forming a resist film on the Si-containing resist underlayer film;

a step of exposing the resist film to light;

a step of developing the resist film after the light exposure, to thereby form a resist pattern;

a step of etching the Si-containing resist underlayer film with the resist pattern;

a step of etching the organic underlayer film with the patterned resist film and Si-containing resist underlayer film; and a step of processing the semiconductor substrate with the patterned resist film, Si-containing resist underlayer film, and organic underlayer film.

14. A hetero-ring-containing silane of the following Formula (1):

$$R^1R^2_aSi(R^3)_{3-a} \quad (1)$$

(wherein $R^1$ is an organic group containing a furan ring and/or a thiophene ring;

$R^2$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group;

$R^3$ is a group or atom bonded to a silicon atom, and is each independently an alkoxy group, an aralkyloxy group, an acyloxy group, or a halogen atom;

the organic group containing a furan ring and/or a thiophene ring of $R^1$ and the alkoxy group, aralkyloxy group, or acyloxy group of $R^3$ are optionally bonded together to form a ring; and a is an integer of 0 to 2).

15. The hetero-ring-containing silane according to 14, wherein the organic group containing a furan ring and/or a thiophene ring is a group of the following Formula (K):

(K)

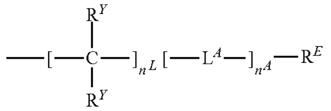

[wherein $n^L$ is an integer of 0 to 10;

$n^A$ is an integer of 0 to 5;

$R^Y$ is each independently a hydrogen atom, a methyl group, an ethyl group, a nitro group, a cyano group, a hydroxy group, a thiol group, a furan-ring-containing group, or a thiophene-ring-containing group, and ($n^L$×2) $R^Y$s are optionally identical to or different from one another;

$R^E$ is a hydrogen atom, a methyl group, an ethyl group, a nitro group, a cyano group, a hydroxy group, a thiol group, a furan-ring-containing group, or a thiophene-ring-containing group;

$L^A$ is each independently a divalent group of any of the following Formulae (L1), (L2), (L3), (L4), (L5), (L6a), (L6b), (L7), (L8), (L9a), (L9b), and (L10):

(L1)

(L2)

(L3)

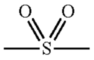

(L4)

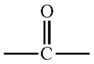

(L5)

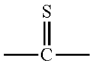

(L6a)

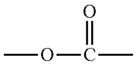

(L6b)

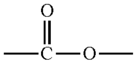

(L7)

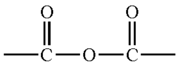

(L8)

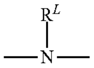

(L9a)

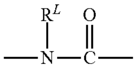

(L9b)

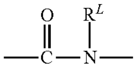

(L10)

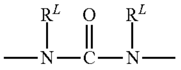

(wherein $R^L$ is each independently a hydrogen atom, an alkyl group, or an aryl group);

when $n^L$ is 0, $n^A$ is 0, and $R^E$ is a furan-ring-containing group or a thiophene-ring-containing group; when $n^L$ is 1 or more, at least one of ($n^L$×2) $R^Y$s and $R^E$ is a furan-ring-containing group or a thiophene-ring-containing group; and when a plurality of -$L^A$- groups are present, the -$L^A$- groups are not bonded together].

Effects of the Invention

The composition of the present invention contains at least one selected from a hydrolyzable silane having a specific organic group containing a furan ring and/or a thiophene ring, a hydrolysate of the silane, and a hydrolysis condensate of the silane, and the organic group is a functional group having high polarity. Thus, a thin film formed from the composition exhibits favorable adhesion to an EUV resist. Since the organic group contains oxygen or sulfur at a high concentration, a thin film formed from the composition exhibits a high rate of etching with fluorine and favorable etching processability. Thus, the use of the composition of the present invention can achieve formation of a fine resist and high transferability to an underlying substrate.

MODES FOR CARRYING OUT THE INVENTION

The present invention will next be described in more detail.

The "solid content" of the film-forming composition of the present invention refers to all components (except for the solvent) contained in the composition.

As described below, the film-forming composition of the present invention contains at least one selected from a specific hydrolyzable silane, a hydrolysate of the silane, and a hydrolysis condensate of the silane; i.e., the composition contains one, two, or three species of these. The hydrolysate or the hydrolysis condensate includes an incomplete hydrolysate (i.e., a partial hydrolysate) or a partial hydrolysis condensate.

The film-forming composition of the present invention contains at least one selected from a hydrolyzable silane, a hydrolysate of the silane, and a hydrolysis condensate of the silane, and a solvent, and the hydrolyzable silane contains a hetero-ring-containing silane of the following Formula (1).

$$R^1R^2_aSi(R^3)_{3-a} \quad (1)$$

$R^1$ is an organic group containing a furan ring and/or a thiophene ring.

No particular limitation is imposed on the organic group, so long as it contains at least one of a furan ring and a thiophene ring in its molecule. The organic group is, for example, a furan-ring-containing group itself, a thiophene-ring-containing group itself, or a group composed of a spacer group and one or more furan-ring-containing groups and/or one or more thiophene-ring-containing groups bonded to the spacer group.

The furan-ring-containing group is a group containing a furan ring. No particular limitation is imposed on the furan-ring-containing group, so long as it contains one or more furan rings. The furan-ring-containing group is, for example, a substituted or unsubstituted 2-furanyl group, a substituted or unsubstituted 3-furanyl group, or a substituted or unsubstituted furan-ring-containing fused ring. Specific examples of the furan-ring-containing group include, but are not limited to, those described below.

(F1)

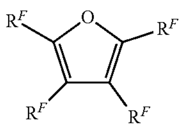

(F2)

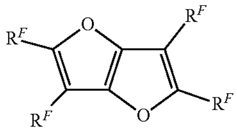

-continued (F3)

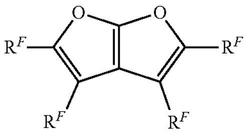

(F4)

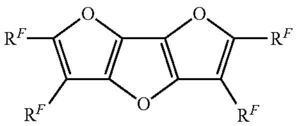

(F5)

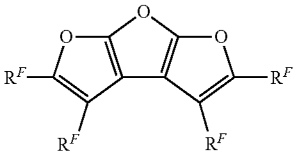

(F6)

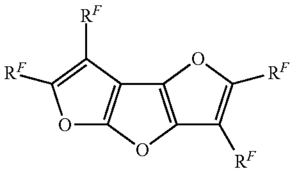

(F7)

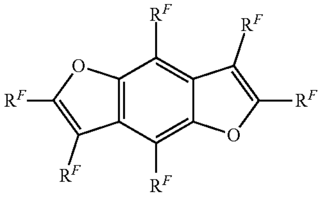

(F8)

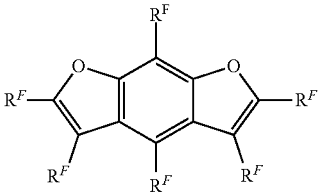

(F9)

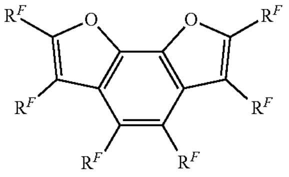

(F10)

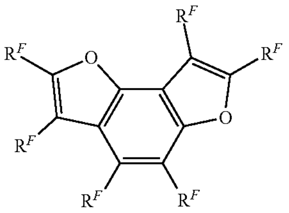

-continued (F11)

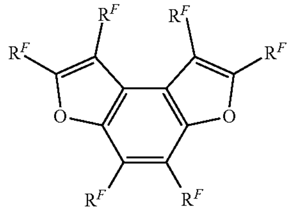

(In Formulae (F1) to (F11), $R^F$ is each independently a single bond, a hydrogen atom, any atom other than a hydrogen atom, or any substituent; and one $R^F$ in each Formula is a single bond and is bonded to the silicon atom in Formula (1) directly or via a spacer group described below.)

The thiophene-ring-containing group is a group containing a thiophene ring. No particular limitation is imposed on the thiophene-ring-containing group, so long as it contains one or more thiophene rings. The thiophene-ring-containing group is, for example, a substituted or unsubstituted 2-thienyl group, a substituted or unsubstituted 3-thienyl group, or a substituted or unsubstituted thiophene-ring-containing fused ring. Specific examples of the thiophene-ring-containing group include, but are not limited to, those described below.

(T1)

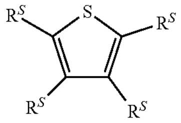

(T2)

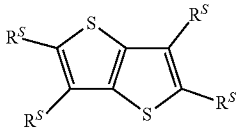

(T3)

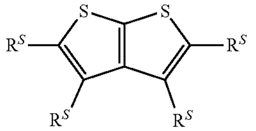

(T4)

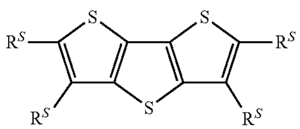

(T5)

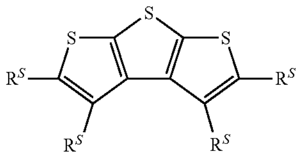

(T6)

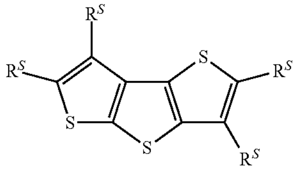

-continued (T7)

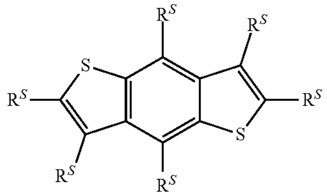

(T8)

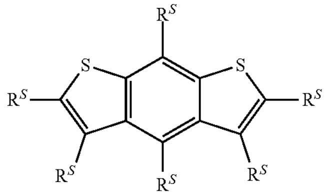

(T9)

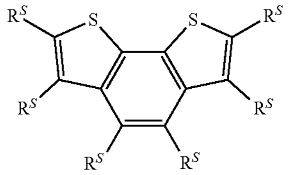

(T10)

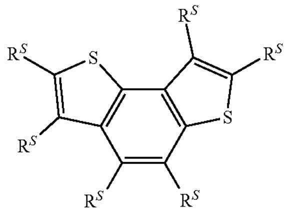

(T11)

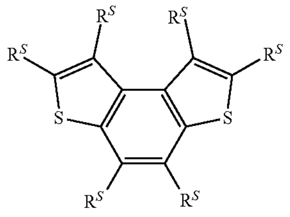

(In Formulae (T1) to (T11), $R^S$ is each independently a single bond, a hydrogen atom, any atom other than a hydrogen atom, or any substituent; and one $R^S$ in each Formula is a single bond and is bonded to the silicon atom in Formula (1) directly or via a spacer group described below.)

The spacer group intervenes between the silicon atom in Formula (1) and a furan-ring-containing group and/or a thiophene-ring-containing group, and is a di- or more-valent group. The valence of the spacer group is determined depending on the number of furan-ring-containing groups and thiophene-ring-containing groups. For example, when the total number of furan-ring-containing groups and thiophene-ring-containing groups is 1, the spacer group is divalent. In this case, one bonding hand is used for bonding to the silicon atom in Formula (1), and the other bonding hand is used for bonding to a furan-ring-containing group or a thiophene-ring-containing group.

No particular limitation is imposed on the spacer group, so long as it is a di- or more-valent group. Typical examples of the spacer group include a di- or more-valent aliphatic hydrocarbon group and a di- or more-valent aromatic hydrocarbon group.

The di- or more-valent aliphatic hydrocarbon group is a group derived from an aliphatic hydrocarbon compound through removal of two or more hydrogen atoms. The di- or more-valent aliphatic hydrocarbon group may have a linear, branched, or cyclic structure, and may be a group derived from an alkane, a group derived from an alkene, or a group derived from an alkyne. No particular limitation is imposed on the carbon atom number of the aliphatic hydrocarbon group, but the carbon atom number is generally 40 or less, preferably 30 or less, more preferably 20 or less, still more preferably 10 or less.

Specific examples of the group derived from an alkane include, but are not limited to, alkylene groups, for example, linear alkylene groups such as methylene group, ethylene group, trimethylene group, tetramethylene group, pentamethylene group, hexamethylene group, heptamethylene group, octamethylene group, nonamethylene group, and decamethylene group, and branched alkylene groups such as 1-methyltrimethylene group, 2-methyltrimethylene group, 1,1-dimethylethylene group, 1-methyltetramethylene group, 2-methyltetramethylene group, 1,1-dimethyltrimethylene group, 1,2-dimethyltrimethylene group, 2,2-dimethyltrimethylene group, and 1-ethyltrimethylene group; and alkanetriyl groups such as methanetriyl group, ethane-1,1,2-triyl group, ethane-1,2,2-triyl group, ethane-2,2,2-triyl group, propane-1,1,1-triyl group, propane-1,1,2-triyl group, propane-1,2,3-triyl group, propane-1,2,2-triyl group, propane-1,1,3-triyl group, butane-1,1,1-triyl group, butane-1,1,2-triyl group, butane-1,1,3-triyl group, butane-1,2,3-triyl group, butane-1,2,4-triyl group, butane-1,2,2-triyl group, butane-2,2,3-triyl group, 2-methylpropane-1,1,1-triyl group, 2-methylpropane-1,1,2-triyl group, 2-methylpropane-1,1,3-triyl group, and 2-methylpropane-1,1,1-triyl group.

Specific examples of the group derived from an alkene include, but are not limited to, alkenediyl groups such as ethylene-1,1-diyl group, ethylene-1,2-diyl group, propene-1,1-diyl group, propene-1,2-diyl group, propene-1,3-diyl group, 1-butene-1,1-diyl group, 1-butene-1,2-diyl group, 1-butene-1,3-diyl group, 1-butene-1,4-diyl group, 1-pentene-1,1-diyl group, 1-pentene-1,2-diyl group, 1-pentene-1,3-diyl group, 1-pentene-1,4-diyl group, and 1-pentene-1,5-diyl group; and alkenetriyl groups such as ethylene-1,1,2-triyl group, ethylene-1,2,2-triyl group, propene-1,1,2-triyl group, propene-1,1,3-triyl group, propene-1,2,2-triyl group, propene-1,3,3-triyl group, propene-1,2,3-triyl group, 1-butene-1,1,2-triyl group, 1-butene-1,1,3-triyl group, 1-butene-1,1,4-triyl group, 1-butene-1,2,3-triyl group, 1-butene-1,2,4-triyl group, 1-butene-1,3,4-triyl group, 1-butene-1,2,2-triyl group, 1-butene-1,3,3-triyl group, and 1-butene-1,4,4-triyl group.

Examples of the group derived from an alkyne include, but are not limited to, alkynediyl groups such as acetylenediyl group, propyne-1,2-diyl group, propyne-1,3-diyl group, 1-butyne-1,2-diyl group, 1-butyne-1,3-diyl group, 1-butyne-1,4-diyl group, 1-pentyne-1,2-diyl group, 1-pentyne-1,3-diyl group, 1-pentyne-1,4-diyl group, and 1-pentyne-1,5-diyl group; and alkynetriyl groups such as propyne-1,2,2-triyl group, propyne-1,3,3-triyl group, propyne-1,2,3-triyl group, 1-butyne-1,2,2-triyl group, 1-butyne-1,3,3-triyl group, 1-butyne-1,4,4-triyl group, 1-butyne-1,2,3-triyl group, 1-butyne-1,2,4-triyl group, 1-butyne-1,3,4-triyl group, 1-pentyne-1,2,2-triyl group, 1-pentyne-1,3,3-triyl group, 1-pentyne-1,4,4-triyl group, 1-pentyne-1,5,5-triyl group, 1-pentyne-1,2,3-triyl group, 1-pentyne-1,2,4-triyl group, 1-pentyne-1,2,5-triyl group, 1-pentyne-1,3,4-triyl group, 1-pentyne-1,3,5-triyl group, 1-pentyne-1,4,5-triyl group, 1-pentyne-1,2,2-triyl group, 1-pentyne-1,3,3-triyl group, 1-pentyne-1,4,4-triyl group, and 1-pentyne-1,5,5-triyl group.

The di- or more-valent aliphatic hydrocarbon group (i.e., spacer group) may contain, at the end and/or middle thereof, an ether group (—O—), a thioether group (—S—), a carbonyl group (—CO—), an ester group (—CO—O—), an amino group (—NR$^{AM}$— (wherein R$^{AM}$ is, for example, a hydrogen atom, a $C_{1-10}$ alkyl group, or a $C_{6-10}$ aryl group)), or an amide group (—CO—NR$^{AD}$— (wherein R$^{AD}$ is, for example, a hydrogen atom, a $C_{1-10}$ alkyl group, or a $C_{6-10}$ aryl group)).

The di- or more-valent aliphatic hydrocarbon group (i.e., spacer group) may be substituted with a substituent Z or may be substituted with an aryl group, alkoxy group, thioalkoxy group, alkylaryl group, or carbonylaryl group that may be substituted with a substituent Z.

The substituent Z is a heteroatom-containing substituent having a molecular weight of 100 or less and composed of a halogen atom, or a hydrogen atom, a carbon atom, a nitrogen atom, an oxygen atom, and a sulfur atom, such as a halogen atom, an amino group, a nitro group, a cyano group, a hydroxy group, or a thiol group.

Examples of the halogen atom include fluorine atom, chlorine atom, bromine atom, and iodine atom.

The di- or more-valent aromatic hydrocarbon group is a group derived from an aromatic hydrocarbon compound through removal of two or more hydrogen atoms. Such an aromatic hydrocarbon compound may be benzene, a fused-ring aromatic hydrocarbon compound, or a ring-connected aromatic hydrocarbon compound. No particular limitation is imposed on the carbon atom number of the aromatic hydrocarbon group, but the carbon atom number is generally 40 or less, preferably 30 or less, more preferably 20 or less.

Specific examples of the group derived from benzene include benzene-1,2-diyl group, benzene-1,3-diyl group, benzene-1,4-diyl group, benzene-1,2,3-triyl group, benzene-1,2,4-triyl group, and benzene-1,3,5-triyl group.

Specific examples of the group derived from a fused-ring aromatic hydrocarbon compound include, but are not limited to, divalent groups derived from a fused-ring aromatic hydrocarbon compound, such as naphthalene-1,2-diyl group, naphthalene-1,3-diyl group, naphthalene-1,4-diyl group, naphthalene-1,5-diyl group, naphthalene-1,6-diyl group, naphthalene-1,7-diyl group, naphthalene-1,8-diyl group, naphthalene-2,3-diyl group, naphthalene-2,6-diyl group, naphthalene-2,7-diyl group, anthracene-1,2-diyl group, anthracene-1,3-diyl group, anthracene-1,4-diyl group, anthracene-1,5-diyl group, anthracene-1,6-diyl group, anthracene-1,7-diyl group, anthracene-1,8-diyl group, anthracene-1,9-diyl group, anthracene-1,10-diyl group, anthracene-2,3-diyl group, anthracene-2,6-diyl group, anthracene-2,7-diyl group, anthracene-2,9-diyl group, anthracene-2,10-diyl group, and anthracene-9,10-diyl group; and trivalent groups derived from a fused-ring aromatic hydrocarbon compound, such as naphthalene-1,2,3-triyl group, naphthalene-1,2,4-triyl group, naphthalene-1,2,5-triyl group, naphthalene-1,2,6-triyl group, naphthalene-1,2,7-triyl group, naphthalene-1,2,8-triyl group, naphthalene-1,3,5-triyl group, naphthalene-1,3,6-triyl group, naphthalene-1,3,7-triyl group, naphthalene-1,3,8-triyl group, naphthalene-1,4,5-triyl group, naphthalene-1,4,6-triyl group, naphthalene-1,4,7-triyl group, naphthalene-1,4,8-triyl group, naphthalene-2,3,5-triyl group, naphthalene-2,3,6-triyl group, naphthalene-2,3,7-triyl group, and naphthalene-2,3,8-triyl group.

Specific examples of the group derived from a ring-connected aromatic hydrocarbon compound include, but are not limited to, divalent groups derived from a ring-connected aromatic hydrocarbon compound, such as biphenyl-2,2'-diyl group, biphenyl-2,3'-diyl group, biphenyl-2,4'-diyl group, biphenyl-3,3'-diyl group, biphenyl-3,4'-diyl group, biphenyl-4,4'-diyl group, p-terphenyl-2,2'-diyl group, p-terphenyl-2,3'-diyl group, p-terphenyl-2,2"-diyl group, p-terphenyl-2,3"-diyl group, p-terphenyl-2,4"-diyl group, p-terphenyl-3,2'-diyl group, p-terphenyl-3,3'-diyl group, p-terphenyl-3,3"-diyl group, p-terphenyl-3,4"-diyl group, p-terphenyl-4,4"-diyl group, p-terphenyl-2',3'-diyl group, p-terphenyl-2',5'-diyl group, and p-terphenyl-2',6'-diyl group; and trivalent groups derived from a ring-connected aromatic hydrocarbon compound, such as biphenyl-2,3,2'-triyl group, biphenyl-2,3,3'-triyl group, biphenyl-2,3,4'-triyl group, biphenyl-2,4,2'-triyl group, biphenyl-2,4,3'-triyl group, biphenyl-2,4,4'-triyl group, biphenyl-2,5,2'-triyl group, biphenyl-2,5,3'-triyl group, biphenyl-2,5,4'-triyl group, biphenyl-2,6,2'-triyl group, biphenyl-2,6,3'-triyl group, biphenyl-2,6,4'-triyl group, biphenyl-3,4,2'-triyl group, biphenyl-3,4,3'-triyl group, biphenyl-3,4,4'-triyl group, biphenyl-3,5,2'-triyl group, biphenyl-3,5,3'-triyl group, and biphenyl-3,5,4'-triyl group.

In one preferred embodiment of the present invention, the furan-ring-containing group is a monovalent group of any of the following Formulae (F1-1a), (F1-1b), (F2-2), (F3-3), (F4-4), (F5-1), (F6-1), (F7-1), (F8-1), (F9-1), (F10-1), and (F11-1). In particular, the furan-ring-containing group is preferably a group of the following Formula (F1-1a) or (F1-1b).

(F1-1a)

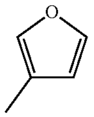

(F1-1b)

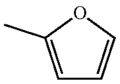

(F2-2)

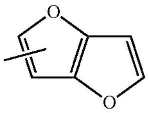

(F3-3)

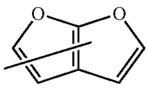

(F4-4)

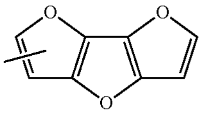

(F5-1)

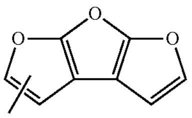

(F6-1)

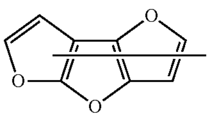

-continued (F7-1)

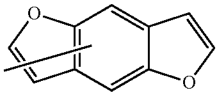

(F8-1)

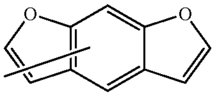

(F9-1)

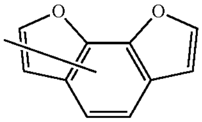

(F10-1)

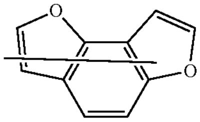

(F11-1)

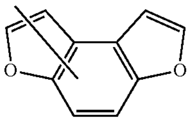

In one preferred embodiment of the present invention, the thiophene-ring-containing group is a monovalent group of any of the following Formulae (T1-1a), (T1-1b), (T2-2), (T3-3), (T4-4), (T5-1), (T6-1), (T7-1), (T8-1), (T9-1), (T10-1), and (T11-1). In particular, the thiophene-ring-containing group is preferably a group of the following Formula (T1-1a) or (T1-1b).

(T1-1a)

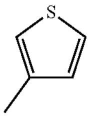

(T1-1b)

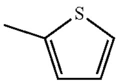

(T2-2)

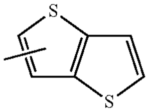

(T3-3)

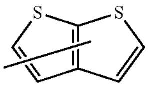

(T4-4)

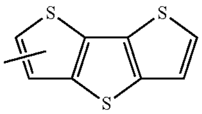

(T5-1)

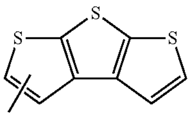

-continued (T6-1)

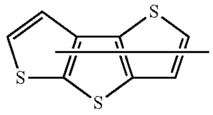

(T7-1)

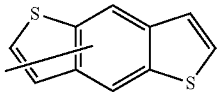

(T8-1)

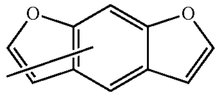

(T9-1)

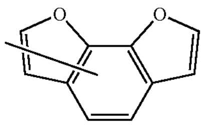

(T10-1)

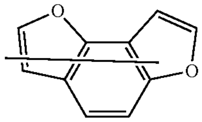

(T11-1)

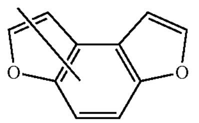

In one preferred embodiment of the present invention, the organic group containing a furan ring and/or a thiophene ring is a group of the following Formula (K).

(K)

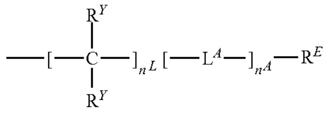

In Formula (K), $n^L$ is an integer of 0 to 10, and is preferably 8 or less, more preferably 6 or less.

In Formula (K), $n^A$ is an integer of 0 to 5, and is preferably 4 or less, more preferably 3 or less, still more preferably 2 or less, much more preferably 1 or 0.

$R^Y$ is each independently a hydrogen atom, a halogen atom, a methyl group, an ethyl group, a nitro group, a cyano group, a hydroxy group, a thiol group, a furan-ring-containing group, or a thiophene-ring-containing group, and ($n^L$×2) $R^Y$s may be identical to or different from one another. $R^E$ is a hydrogen atom, a methyl group, an ethyl group, a nitro group, a cyano group, a hydroxy group, a thiol group, a furan-ring-containing group, or a thiophene-ring-containing group. When $n^L$ is 0, $n^A$ is 0, and $R^Y$ is a furan-ring-containing group or a thiophene-ring-containing group. When $n^L$ is 1 or more, at least one (preferably one to five, more preferably one to three, still more preferably one or two) of ($n^L$×2) $R^Y$s and $R^E$ is a furan-ring-containing group or a thiophene-ring-containing group.

In the organic group containing a furan ring and/or a thiophene ring of Formula (K), the total number of a halogen atom, a nitro group, a cyano group, a hydroxy group, and a thiol group represented by ($n^L$×2) $R^Y$s and $R^E$ is preferably 5 or less, more preferably 4 or less, still more preferably 3 or less, much more preferably 2 or less, and the remaining radical may be a hydrogen atom, a methyl group, an ethyl group, a furan-ring-containing group, or a thiophene-ring-containing group.

$L^A$ is each independently a divalent group of any of the following Formulae (L1), (L2), (L3), (L4), (L5), (L6a), (L6b), (L7), (L8), (L9a), (L9b), and (L10), and is preferably a group of the following Formula (L1), (L2), or (L4).

(L1)

(L2)

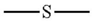

(L3)

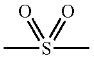

(L4)

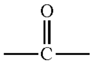

(L5)

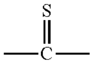

(L6a)

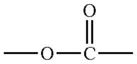

(L6b)

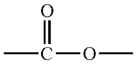

(L7)

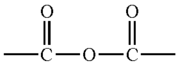

(L8)

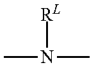

(L9a)

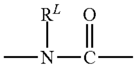

(L9b)

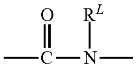

(L10)

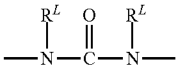

$R^L$ is each independently a hydrogen atom, an alkyl group, or an aryl group, and is preferably a hydrogen atom.

No particular limitation is imposed on the alkyl group, and the alkyl group may have a linear, branched, or cyclic structure. The carbon atom number of the alkyl group is generally 40 or less, preferably 30 or less, more preferably 20 or less, still more preferably 10 or less, much more preferably 5 or less.

Specific examples of the linear or branched alkyl group include, but are not limited to, methyl group, ethyl group, n-propyl group, isopropyl group, n-butyl group, isobutyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2- dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group. Of these, a linear lower alkyl group is preferred, and a methyl group or an ethyl group is more preferred.

Specific examples of the cyclic alkyl group include, but are not limited to, cycloalkyl groups, such as cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-isopropyl-cyclopropyl group, 2-isopropyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group; and bicycloalkyl groups, such as bicyclobutyl group, bicyclopentyl group, bicyclohexyl group, bicycloheptyl group, bicyclooctyl group, bicyclononyl group, and bicyclodecyl group.

The aryl group may be a phenyl group, a monovalent group derived from a fused-ring aromatic hydrocarbon compound through removal of one hydrogen atom, or a monovalent group derived from a ring-connected aromatic hydrocarbon compound through removal of one hydrogen atom. No particular limitation is imposed on the carbon atom number of the aryl group, but the carbon atom number is preferably 40 or less, more preferably 30 or less, still more preferably 20 or less, much more preferably 10 or less.

Specific examples of the aryl group include, but are not limited to, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 5-naphthacenyl group, 2-chrysenyl group, 1-pyrenyl group, 2-pyrenyl group, pentacenyl group, benzopyrenyl group, triphenylenyl group, biphenyl-2-yl group, biphenyl-3-yl group, biphenyl-4-yl group, p-terphenyl-4-yl group, m-terphenyl-4-yl group, o-terphenyl-4-yl group, 1,1'-binaphthyl-2-yl group, and 2,2'-binaphthyl-1-yl group. Of these, phenyl group, 1-naphthyl group, or 2-naphthyl group is preferred.

The group of Formula (K) has a chain group composed of $n^L$-$C(R^Y)_2$— groups and $n^A$-$L^A$- groups, and an $R^E$ group at the end of the chain group. No particular limitation is imposed on the bonding order of $n^L$-$C(R^Y)_2$— groups and $n^A$-$L^A$- groups in the chain group, so long as a -$L^A$- group is not bonded to a silicon atom in Formula (1), and, when two or more -$L^A$- groups are present, the -$L^A$- groups are not bonded together. Thus, the -$L^A$- group may be present between the —$C(R^Y)_2$— group and the $R^E$ group. When a plurality of —$C(R^Y)_2$— groups are present, the -$L^A$- group may be present between two —$C(R^Y)_2$— groups.

When, for example, $n^L$ is 2, all the $R^Y$s are a methyl group, $n^A$ is 1, $L^A$ is a group of Formula (L1), and $R^E$ is a 3-thienyl group, Formula (K) includes Formulae (K1) and (K2) but does not include Formula (K3).

(K1)

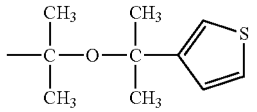

(K2)

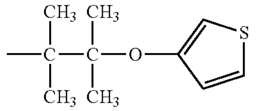

(K3)

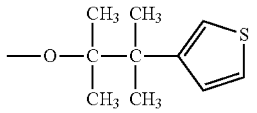

$R^2$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group. The substituent of the alkyl group, the aryl group, the aralkyl group, the halogenated alkyl group, the halogenated aryl group, the halogenated aralkyl group, the alkoxyalkyl group, the alkoxyaryl group, the alkoxyaralkyl group, and the alkenyl group is, for example, an alkyl group, an aryl group, an aralkyl group, a halogenated alkyl group, a halogenated aryl group, a halogenated aralkyl group, an alkoxyalkyl group, an alkoxyaryl group, an alkoxyaralkyl group, an alkenyl group, an alkoxy group, an aryloxy group, or an aralkyloxy group. Specific examples of these groups and preferred carbon atom numbers thereof are the same as those described above or below. When two or more substituents are present, the substituents may be bonded together to form a ring.

The aralkyl group is an alkyl group substituted with an aryl group, and specific examples of the aryl group and the alkyl group are the same as those described above.

No particular limitation is imposed on the carbon atom number of the aralkyl group, but the carbon atom number is preferably 40 or less, more preferably 30 or less, still more preferably 20 or less.

Specific examples of the aralkyl group include, but are not limited to, phenylmethyl group (benzyl group), 2-phenylethylene group, 3-phenyl-n-propyl group, 4-phenyl-n-butyl group, 5-phenyl-n-pentyl group, 6-phenyl-n-hexyl group, 7-phenyl-n-heptyl group, 8-phenyl-n-octyl group, 9-phenyl-n-nonyl group, and 10-phenyl-n-decyl group.

The halogenated alkyl group is an alkyl group substituted with a halogen atom, and specific examples of the alkyl group and the halogen atom are the same as those described above.

No particular limitation is imposed on the carbon atom number of the halogenated alkyl group, but the carbon atom number is preferably 40 or less, more preferably 30 or less, still more preferably 20 or less, much more preferably 10 or less.

Specific examples of the halogenated alkyl group include, but are not limited to, monofluoromethyl group, difluoromethyl group, trifluoromethyl group, bromodifluoromethyl group, 2-chloroethyl group, 2-bromoethyl group, 1,1-difluoroethyl group, 2,2,2-trifluoroethyl group, 1,1,2,2-tetrafluoroethyl group, 2-chloro-1,1,2-trifluoroethyl group, pentafluoroethyl group, 3-bromopropyl group, 2,2,3,3-tetrafluoropropyl group, 1,1,2,3,3,3-hexafluoropropyl group, 1,1,1,3,3,3-hexafluoropropan-2-yl group, 3-bromo-2-methylpropyl group, 4-bromobutyl group, and perfluoropentyl group.

The halogenated aryl group is an aryl group substituted with a halogen atom, and specific examples of the aryl group and the halogen atom are the same as those described above.

No particular limitation is imposed on the carbon atom number of the halogenated aryl group, but the carbon atom number is preferably 40 or less, more preferably 30 or less, still more preferably 20 or less.

Specific examples of the halogenated aryl group include, but are not limited to, 2-fluorophenyl group, 3-fluorophenyl group, 4-fluorophenyl group, 2,3-difluorophenyl group, 2,4-difluorophenyl group, 2,5-difluorophenyl group, 2,6-difluorophenyl group, 3,4-difluorophenyl group, 3,5-difluorophenyl group, 2,3,4-trifluorophenyl group, 2,3,5-trifluorophenyl group, 2,3,6-trifluorophenyl group, 2,4,5-trifluorophenyl group, 2,4,6-trifluorophenyl group, 3,4,5-trifluorophenyl group, 2,3,4,5-tetrafluorophenyl group, 2,3,4,6-tetrafluorophenyl group, 2,3,5,6-tetrafluorophenyl group, pentafluorophenyl group, 2-fluoro-1-naphthyl group, 3-fluoro-1-naphthyl group, 4-fluoro-1-naphthyl group, 6-fluoro-1-naphthyl group, 7-fluoro-1-naphthyl group, 8-fluoro-1-naphthyl group, 4,5-difluoro-1-naphthyl group, 5,7-difluoro-1-naphthyl group, 5,8-difluoro-1-naphthyl group, 5,6,7,8-tetrafluoro-1-naphthyl group, heptafluoro-1-naphthyl group, 1-fluoro-2-naphthyl group, 5-fluoro-2-naphthyl group, 6-fluoro-2-naphthyl group, 7-fluoro-2-naphthyl group, 5,7-difluoro-2-naphthyl group, and heptafluoro-2-naphthyl group.

The halogenated aralkyl group is an aralkyl group substituted with a halogen atom, and specific examples of the aralkyl group and the halogen atom are the same as those described above.

No particular limitation is imposed on the carbon atom number of the halogenated aralkyl group, but the carbon atom number is preferably 40 or less, more preferably 30 or less, still more preferably 20 or less.

Specific examples of the halogenated aralkyl group include, but are not limited to, 2-fluorobenzyl group, 3-fluorobenzyl group, 4-fluorobenzyl group, 2,3-difluorobenzyl group, 2,4-difluorobenzyl group, 2,5-difluorobenzyl group, 2,6-difluorobenzyl group, 3,4-difluorobenzyl group, 3,5-difluorobenzyl group, 2,3,4-trifluorobenzyl group, 2,3,5-trifluorobenzyl group, 2,3,6-trifluorobenzyl group, 2,4,5-trifluorobenzyl group, 2,4,6-trifluorobenzyl group, 2,3,4,5-tetrafluorobenzyl group, 2,3,4,6-tetrafluorobenzyl group, 2,3,5,6-tetrafluorobenzyl group, and 2,3,4,5,6-pentafluorobenzyl group.

The alkoxyalkyl group is an alkyl group substituted with an alkoxy group. In the alkoxyalkyl group, the alkyl group substituted with an alkoxy group may have a linear, branched, or cyclic structure. Specific examples of the alkyl group are the same as those described above.

No particular limitation is imposed on the carbon atom number of the alkoxyalkyl group, but the carbon atom number is preferably 40 or less, more preferably 30 or less, still more preferably 20 or less, much more preferably 10 or less.

Specific examples of the alkoxy group (i.e., substituent of the alkyl group) include, but are not limited to, linear or branched alkoxy groups, such as methoxy group, ethoxy group, n-propoxy group, isopropoxy group, n-butoxy group, isobutoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group; and cyclic alkoxy groups, such as cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-isopropyl-cyclopropoxy group, 2-isopropyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Of these, the alkoxy group of the alkoxyalkyl group is preferably a lower alkyloxy group such as a methoxy group or an ethoxy group, and is more preferably a methoxy group.

Specific examples of the alkoxyalkyl group include, but are not limited to, lower alkyloxy lower alkyl groups, such as methoxymethyl group, ethoxymethyl group, 1-ethoxyethyl group, and 2-ethoxyethyl group.

The alkoxyaryl group is an aryl group substituted with an alkoxy group, and specific examples of the alkoxy group and the aryl group are the same as those described above.

Specific examples of the alkoxyaryl group include, but are not limited to, 2-methoxyphenyl group, 3-methoxyphenyl group, 4-methoxyphenyl group, 2-(1-ethoxy)phenyl group, 3-(1-ethoxy)phenyl group, 4-(1-ethoxy)phenyl group, 2-(2-ethoxy)phenyl group, 3-(2-ethoxy)phenyl group, 4-(2-ethoxy)phenyl group, 2-methoxynaphthalen-1-yl group, 3-methoxynaphthalen-1-yl group, 4-methoxynaphthalen-1-yl group, 5-methoxynaphthalen-1-yl group, 6-methoxynaphthalen-1-yl group, and 7-methoxynaphthalen-1-yl group.

The alkoxyaralkyl group is an aralkyl group substituted with an alkoxy group, and specific examples of the alkoxy group and the aralkyl group are the same as those described above.

No particular limitation is imposed on the carbon atom number of the alkoxyaralkyl group, but the carbon atom number is preferably 40 or less, more preferably 30 or less, still more preferably 20 or less.

Specific examples of the alkoxyaralkyl group include, but are not limited to, 3-(methoxyphenyl)benzyl group and 4-(methoxyphenyl)benzyl group.

The alkenyl group may have a linear or branched structure. No particular limitation is imposed on the carbon atom number of the alkenyl group, but the carbon atom number is preferably 40 or less, more preferably 30 or less, still more preferably 20 or less, much more preferably 10 or less.

Specific examples of the alkenyl group include, but are not limited to, ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-isopropylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl- 1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-isobutylethenyl group, 2,2-dimethyl-3-butenyl group, 2,3-dimethyl-1-butenyl group, 2,3-dimethyl-2-butenyl group, 2,3-dimethyl-3-butenyl group, 2-isopropyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-isopropyl-1-propenyl group, 1-isopropyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the organic group containing an epoxy group include, but are not limited to, glycidoxymethyl group, glycidoxyethyl group, glycidoxypropyl group, glycidoxybutyl group, and epoxycyclohexyl group.

Examples of the organic group containing an acryloyl group include, but are not limited to, acryloylmethyl group, acryloylethyl group, and acryloylpropyl group.

Examples of the organic group containing a methacryloyl group include, but are not limited to, methacryloylmethyl group, methacryloylethyl group, and methacryloylpropyl group.

Examples of the organic group containing a mercapto group include, but are not limited to, ethylmercapto group, butylmercapto group, hexylmercapto group, and octylmercapto group.

Examples of the organic group containing an amino group include, but are not limited to, amino group, aminomethyl group, and aminoethyl group.

Examples of the organic group containing a cyano group include, but are not limited to, cyanoethyl group and cyanopropyl group.

$R^3$ is a group or atom bonded to the silicon atom, and is each independently an alkoxy group, an aralkyloxy group, an acyloxy group, or a halogen atom. Specific examples of the alkoxy group and the halogen atom are the same as those described above.

The aralkyloxy group is a group derived from an aralkyl alcohol through removal of a hydrogen atom from the hydroxy group of the alcohol. Specific examples of the aralkyl group are the same as those described above.

No particular limitation is imposed on the carbon atom number of the aralkyloxy group, but the carbon atom number is preferably 40 or less, more preferably 30 or less, still more preferably 20 or less.

Specific examples of the aralkyloxy group include, but are not limited to, phenylmethyloxy group (benzyloxy group), 2-phenylethyleneoxy group, 3-phenyl-n-propyloxy group, 4-phenyl-n-butyloxy group, 5-phenyl-n-pentyloxy group, 6-phenyl-n-hexyloxy group, 7-phenyl-n-heptyloxy group, 8-phenyl-n-octyloxy group, 9-phenyl-n-nonyloxy group, and 10-phenyl-n-decyloxy group.

The acyloxy group is a group derived from a carboxylic acid compound through removal of a hydrogen atom from the carboxylic acid group of the compound. Typical examples of the acyloxy group include, but are not limited to, an alkylcarbonyloxy group, an arylcarbonyloxy group, or an aralkylcarbonyloxy group, which is respectively derived from an alkylcarboxylic acid, an arylcarboxylic acid, or an aralkylcarboxylic acid through removal of a hydrogen atom from the carboxylic acid group of the acid. Specific examples of the alkyl group, the aryl group, and the aralkyl group of such alkylcarboxylic acid, arylcarboxylic acid, and aralkylcarboxylic acid are the same as those described above.

Specific examples of the acyloxy group include, but are not limited to, methylcarbonyloxy group, ethylcarbonyloxy group, n-propylcarbonyloxy group, isopropylcarbonyloxy group, n-butylcarbonyloxy group, isobutylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

a is an integer of 0 to 2, and is preferably 0 or 1, more preferably 0.

In Formula (1), the organic group containing a furan ring and/or a thiophene ring of $R^1$ and the alkoxy group, aralkyloxy group, or acyloxy group of $R^3$ may be bonded together to form a ring.

Thus, the hetero-ring-containing silane of Formula (1) includes, for example, a hetero-ring-containing silane of the following Formula (1').

(1')

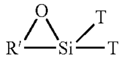

T is each independently a hydroxy group or a $C_{1-3}$ alkoxy group, and is preferably an ethoxy group, a methoxy group, or a hydroxy group.

R' is a divalent group of the following Formula (K').

(K')

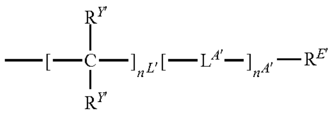

In Formula (K'), $n^{L'}$ is an integer of 1 to 10, and is preferably 8 or less, more preferably 6 or less, still more preferably 4 or less, and is preferably 2 or more, more preferably 3 or more.

In Formula (K'), $n^{A'}$ is an integer of 0 to 5, and is preferably 4 or less, more preferably 3 or less, still more preferably 2 or less, much more preferably 1 or 0.

$R^{Y'}$ is each independently a single bond, a hydrogen atom, a halogen atom, a methyl group, an ethyl group, a nitro group, a cyano group, a hydroxy group, a thiol group, a furan-ring-containing group, or a thiophene-ring-containing group, and ($n^{L'}$×2) $R^{Y'}$s may be identical to or different from one another. $R^{E'}$ is a single bond, a hydrogen atom, a methyl group, an ethyl group, a nitro group, a cyano group, a hydroxy group, a thiol group, a furan-ring-containing group, or a thiophene-ring-containing group. Only one of ($n^{L'}$×2) $R^{Y'}$s and $R^{E'}$ is a single bond and is bonded to an oxygen atom bonded to the silicon atom in Formula (K'), the remaining radials are not a single bond, and at least one (preferably one to five, more preferably one to three, still more preferably one or two) of the remaining radicals is a furan-ring-containing group or a thiophene-ring-containing group.

In Formula (K'), when two or more -$L^{A'}$- groups are present, the -LA'- groups are not bonded together, and the -$L^{A'}$- group may be present between the —C($R^{Y'}$)$_2$— group and the $R^{E'}$ group. When a plurality of —C($R^{Y'}$)$_2$— groups are present, the -$L^{A'}$- group may be present between the —C(RY')$_2$— groups. However, any -$L^{A'}$- group is not bonded directly to the silicon atom in Formula (K').

In the organic group containing a furan ring and/or a thiophene ring of Formula (K'), the total number of a halogen atom, a nitro group, a cyano group, a hydroxy group, and a thiol group represented by ($n^{L'}$×2) $R^{Y'}$s and $R^{E'}$ is preferably 5 or less, more preferably 4 or less, still more preferably 3 or less, much more preferably 2 or less, and the remaining radical may be a hydrogen atom, a methyl group, an ethyl group, a furan-ring-containing group, or a thiophene-ring-containing group.

Specific examples of the hetero-ring-containing silane of Formula (1) include, but are not limited to, those described below. In each Formula, T is each independently a hydroxy group or a $C_{1-3}$ alkoxy group, and is preferably an ethoxy group, a methoxy group, or a hydroxy group.

(1-1-1)

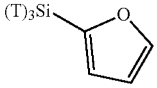

(1-1-2)

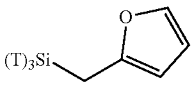

(1-1-3)

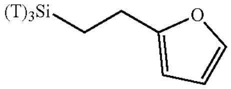

(1-1-4)

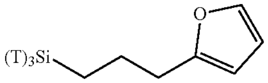

(1-1-5)

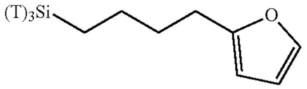

(1-2-1)

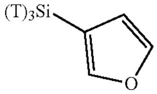

(1-2-2)

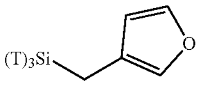

(1-2-3)

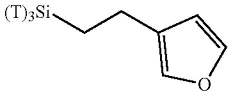

(1-2-4)

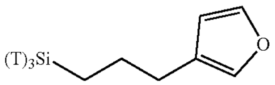

(1-2-5)

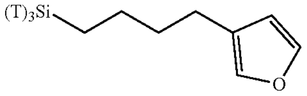

(1-3-1)

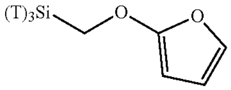

(1-3-2)

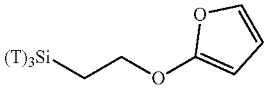

-continued
(1-3-3)
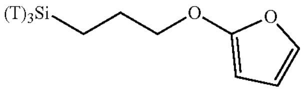
(1-3-4)
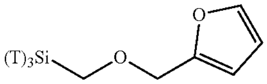
(1-3-5)
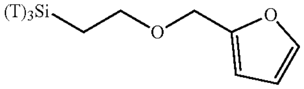
(1-3-6)
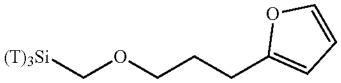
(1-4-1)
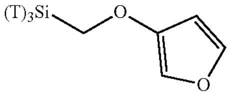
(1-4-2)
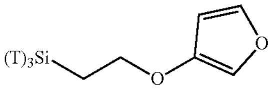
(1-4-3)
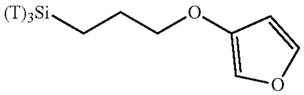
(1-4-4)
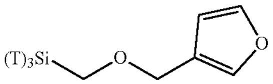
(1-4-5)
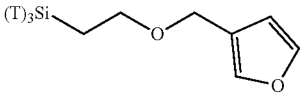
(1-4-6)
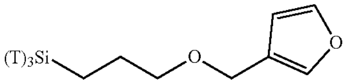
(1-5-1)
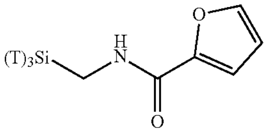
(1-5-2)
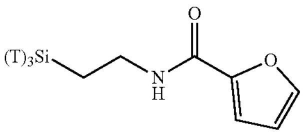
(1-5-3)
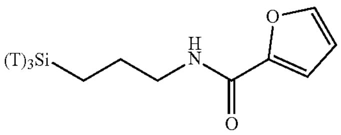
(1-6-1)
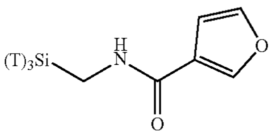
-continued
(1-6-2)
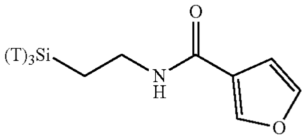
(1-6-3
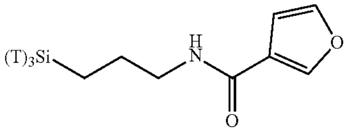
(1-7-1)
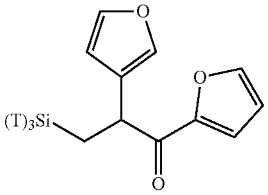
(1-7-2)
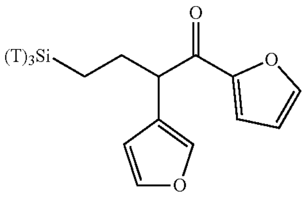
(1-7-3)
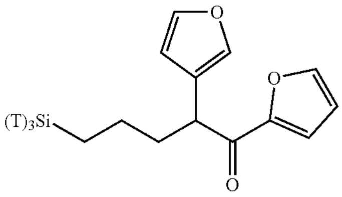
(1-8-1)
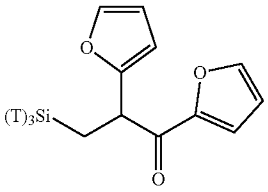
(1-8-2)
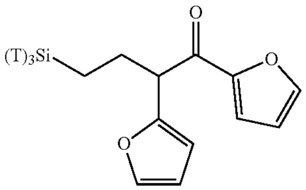
(1-8-3)
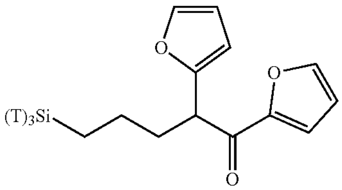
(1-9-1)
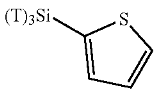

-continued
(1-9-2)
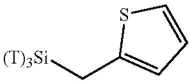
(1-9-3)
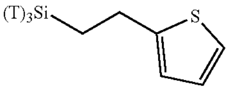
(1-9-4)
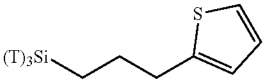
(1-9-5)
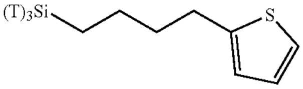
(1-10-1)
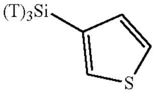
(1-10-2)
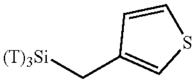
(1-10-3)
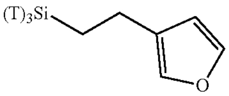
(1-10-4)
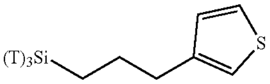
(1-10-5)
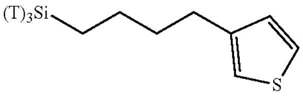
(1-11-1)
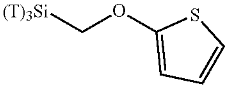
(1-11-2)
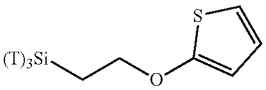
(1-11-3)
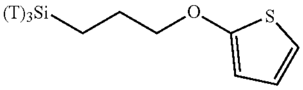
(1-11-4)
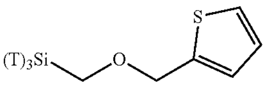
(1-11-5)
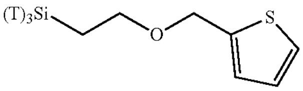
(1-11-6)
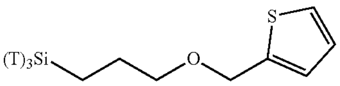
-continued
(1-12-1)
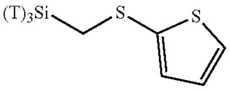
(1-12-2)
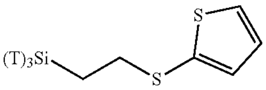
(1-12-3)
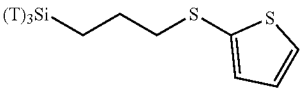
(1-12-4)
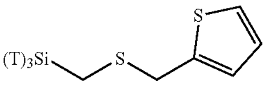
(1-12-5)
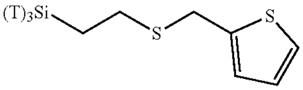
(1-12-6)
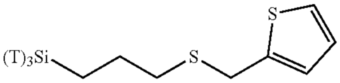
(1-13-1)
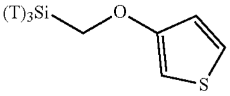
(1-13-2)
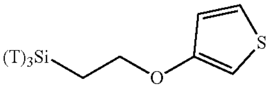
(1-13-3)
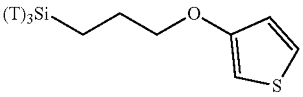
(1-13-4)
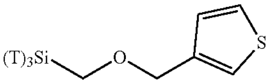
(1-13-5)
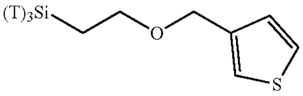
(1-13-6)
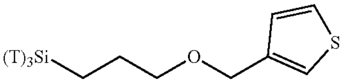
(1-14-1)
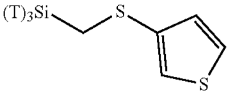
(1-14-2)
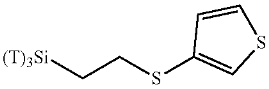
(1-14-3)
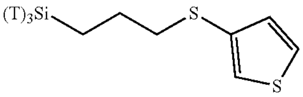

-continued (1-14-4)

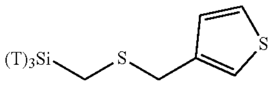

(1-14-5)

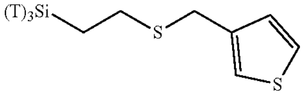

(1-14-6)

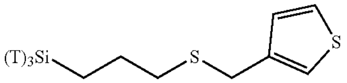

(1-15-1)

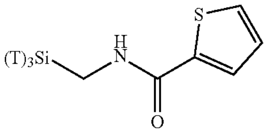

(1-15-2)

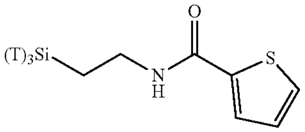

(1-15-3)

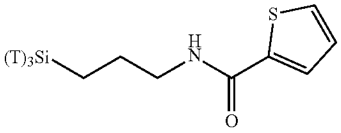

(1-16-1)

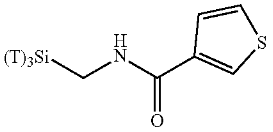

(1-16-2)

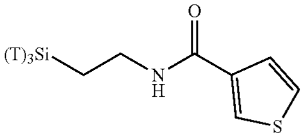

(1-16-3)

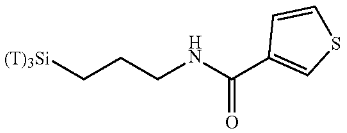

(1-17-1)

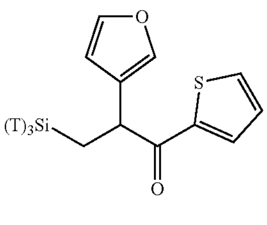

(1-17-2)

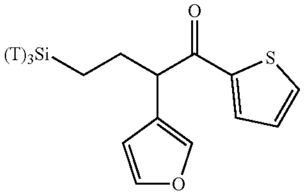

-continued (1-17-3)

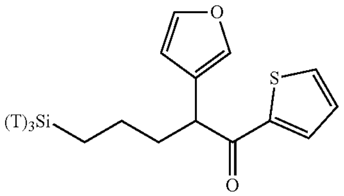

(1-18-1)

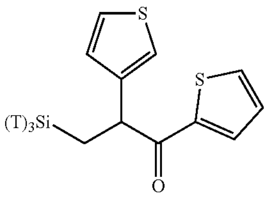

(1-18-2)

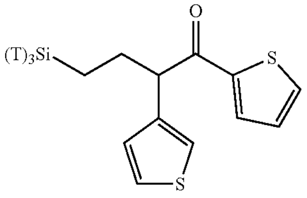

(1-18-3)

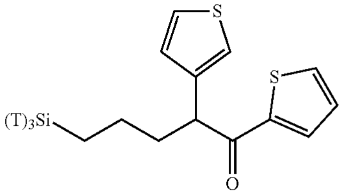

(1-19-1)

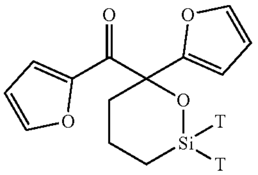

(1-19-2)

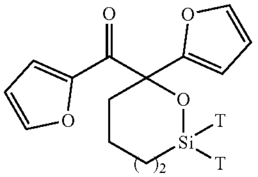

(1-19-3)

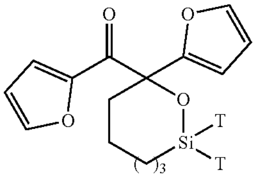

The film-forming composition of the present invention contains a solvent.

No particular limitation is imposed on the solvent, so long as the solvent can dissolve the aforementioned and below-described hydrolyzable silane, a hydrolysate or a hydrolysis condensate of the silane, or an additional component.

Specific examples of the solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mooethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, methyl propyl ketone, methyl butyl ketone, 2-heptanone, 3-heptanone, 4-heptanone, N,N-dimethylformamide, N-methylacetamide, N,N-dimethylacetamide, N-methylpyrrolidone, 4-methyl-2-pentanol, and γ-butyrolactone. These solvents may be used alone or in combination of two or more species.

The film-forming composition of the present invention may contain water as a solvent. The amount of water is preferably 30% by mass or less, more preferably 20% by mass or less, still more preferably 15% by mass or less, relative to the amount of the entire solvent contained in the composition.

In the present invention, the aforementioned hydrolyzable silane may contain at least one selected from an additional silane of the following Formula (2) and an additional silane of the following Formula (3) together with the hetero-ring-containing silane of Formula (1) for the purpose of, for example, adjusting film properties such as film density. Of these additional silanes, the additional silane of Formula (2) is preferred.

$$R^{11}{}_{b}Si(R^{12})_{4-b} \quad (2)$$

$$[R^{21}{}_{c}Si(R^{22})_{3-c}]_{2}Y \quad (3)$$

$R^{11}$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group. $R^{12}$ is a group or atom bonded to a silicon atom, and is each independently an alkoxy group, an aralkyloxy group, an acyloxy group, or a halogen atom. $R^{21}$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group. $R^{22}$ is a group or atom bonded to a silicon atom, and is each independently an alkoxy group, an aralkyloxy group, an acyloxy group, or a halogen atom. Y is an alkylene group or an arylene group. Specific examples of these alkyl group, aryl group, aralkyl group, halogenated alkyl group, halogenated aryl group, halogenated aralkyl group, alkoxyalkyl group, alkoxyaryl group, alkoxyaralkyl group, alkenyl group, alkoxy group, aralkyloxy group, acyloxy group, halogen atom, organic group containing an epoxy group, an acryloyl group, a methacryloyl group, a mercapto group, an amino group, or a cyano group, and alkylene group, and the substituent of the alkyl group, the aryl group, the aralkyl group, the halogenated alkyl group, the halogenated aryl group, the halogenated aralkyl group, the alkoxyalkyl group, the alkoxyaryl group, the alkoxyaralkyl group, and the alkenyl group and preferred carbon atom numbers thereof are the same as those described above.

Specific examples of the arylene group include, but are not limited to, 1,2-phenylene group, 1,3-phenylene group, 1,4-phenylene group; groups derived from a fused-ring aromatic hydrocarbon compound through removal of two hydrogen atoms on the aromatic ring, such as 1,5-naphthalenediyl group, 1,8-naphthalenediyl group, 2,6-naphthalenediyl group, 2,7-naphthalenediyl group, 1,2-anthracenediyl group, 1,3-anthracenediyl group, 1,4-anthracenediyl group, 1,5-anthracenediyl group, 1,6-anthracenediyl group, 1,7-anthracenediyl group, 1,8-anthracenediyl group, 2,3-anthracenediyl group, 2,6-anthracenediyl group, 2,7-anthracenediyl group, 2,9-anthracenediyl group, 2,10-anthracenediyl group, and 9,10-anthracenediyl group; and groups derived from a ring-connected aromatic hydrocarbon compound through removal of two hydrogen atoms on the aromatic ring, such as 4,4'-biphenyldiyl group and 4,4"-p-terphenyldiyl group.

b is an integer of 0 to 3, and is preferably 0 or 1, more preferably 0.

c is each independently an integer of 0 to 2, and is preferably 0 or 1, more preferably 0.

Specific examples of the additional silane of Formula (2) include, but are not limited to, tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, methylvinyldiethoxysilane, and silanes of the following Formulae (A-1) to (A-41).

Of these, a tetrafunctional silane such as tetramethoxysilane or tetraethoxysilane is preferred, from the viewpoints of, for example, increasing the crosslinked density of a film formed from the composition of the present invention, reducing diffusion, etc. of a component of a resist film into the film formed from the composition, and maintaining and improving the resist properties of the resist film.

Formula (A-1)

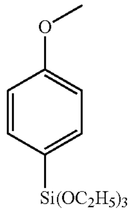

Formula (A-2)

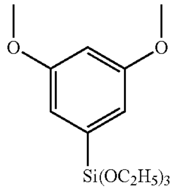

Formula (A-3)

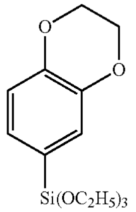

Formula (A-4)

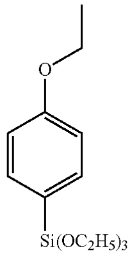

-continued
Formula (A-5)
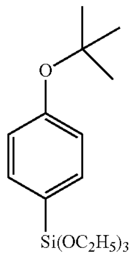
Formula (A-6)
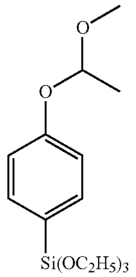
Formula (A-7)
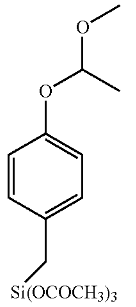
Formula (A-8)
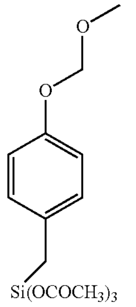
Formula (A-9)
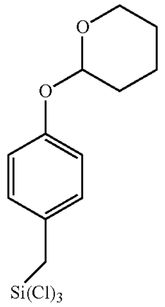
-continued
Formula (A-10)
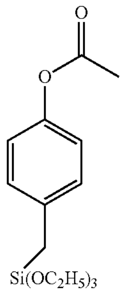
Formula (A-11)
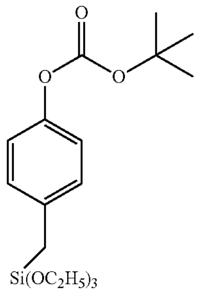
Formula (A-12)
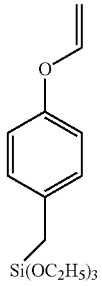
Formula (A-13)
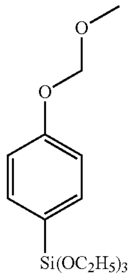
Formula (A-14)
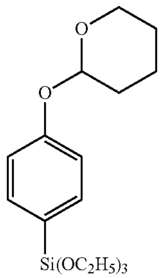

-continued
Formula (A-15)
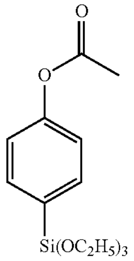
Formula (A-16)
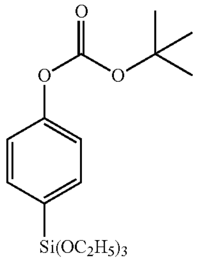
Formula (A-17)
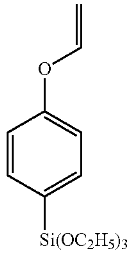
Formula (A-18)
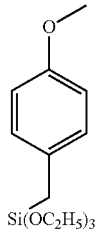
Formula (A-19)
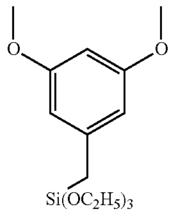
Formula (A-20)
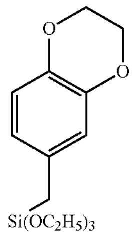
-continued
Formula (A-22)
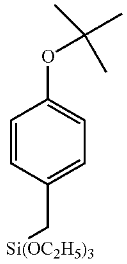
Formula (A-23)
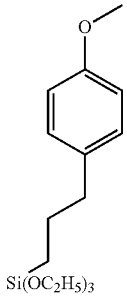
Formula (A-24)
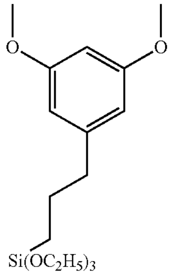
Formula (A-25)
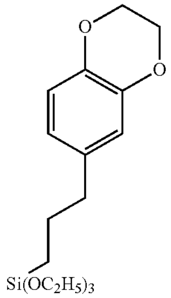
Formula (A-26)
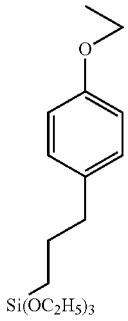

-continued
Formula (A-27)
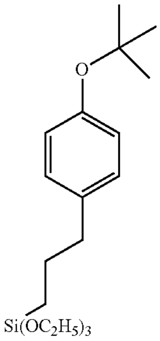
Formula (A-28)
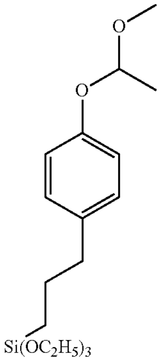
Formula (A-29)
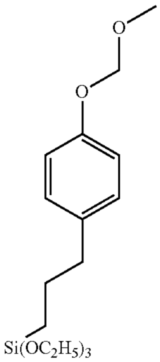
Formula (A-30)
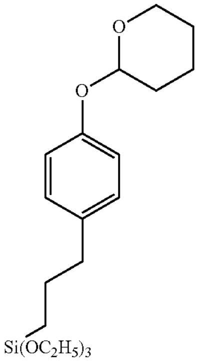
-continued
Formula (A-31)
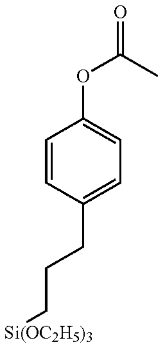
Formula (A-32)
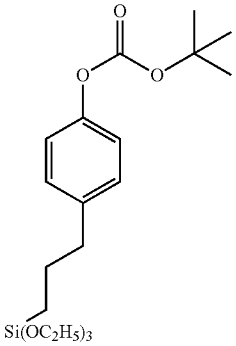
Formula (A-33)
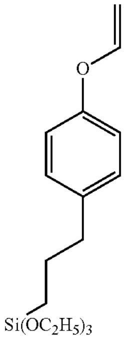
Formula (A-34)
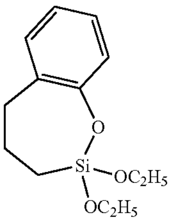
Formula (A-35)
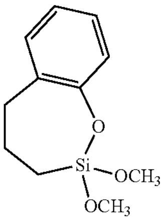

-continued

Formula (A-36)

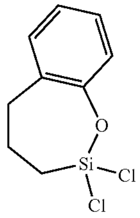

Formula (A-37)

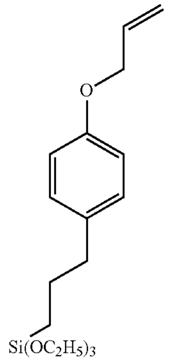

Formula (A-38)

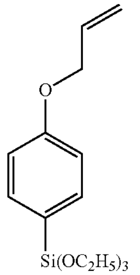

Formula (A-39)

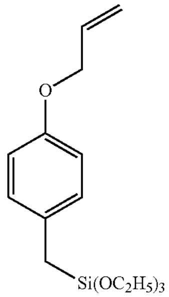

Formula (A-40)

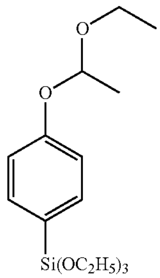

-continued

Formula (A-41)

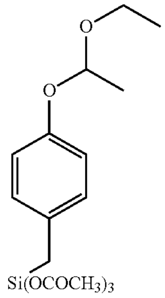

Specific examples of the additional silane of Formula (3) include, but are not limited to, methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

In the present invention, the aforementioned hydrolyzable silane may contain a hydrolyzable organosilane having an onium group in its molecule. The use of a hydrolyzable organosilane having an onium group in its molecule can effectively and efficiently promote the crosslinking reaction of the hydrolyzable silane.

A preferred example of such a hydrolyzable organosilane having an onium group in its molecule is shown in the following Formula (4).

$$R^{31}_{e}R^{32}_{f}Si(R^{33})_{4-(e+f)} \quad (4)$$

$R^{31}$ is a group bonded to a silicon atom, and is an onium group or an organic group containing the onium group; $R^{32}$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group; $R^{33}$ is a group or atom bonded to a silicon atom, and is an alkoxy group, an aralkyloxy group, an acyloxy group, or a halogen atom; e is 1 or 2; f is 0 or 1; and e and f satisfy a relation of $1 \leq e+f \leq 2$.

Specific examples of these alkyl group, aryl group, aralkyl group, halogenated alkyl group, halogenated aryl group, halogenated aralkyl group, alkoxyalkyl group, alkoxyaryl group, alkoxyaralkyl group, alkenyl group, alkoxy group, organic group containing an epoxy group, an acryloyl group, a methacryloyl group, a mercapto group, an amino group, or a cyano group, and the substituent of the alkyl group, the aryl group, the aralkyl group, the halogenated alkyl group, the halogenated aryl group, the halogenated aralkyl group, the alkoxyalkyl group, the alkoxyaryl group, the alkoxyaralkyl group, and the alkenyl group and preferred carbon atom numbers thereof are the same as those described above.

More specifically, the onium group is, for example, a cyclic ammonium group or a chain ammonium group, and is preferably a tertiary ammonium group or a quaternary ammonium group.

Preferred specific examples of the onium group or the organic group containing the onium group include a cyclic ammonium group or a chain ammonium group, or an organic group containing at least one of these ammonium groups. Preferred is a tertiary ammonium group or a quaternary ammonium group, or an organic group containing at least one of these ammonium groups.

When the onium group is a cyclic ammonium group, a nitrogen atom forming the ammonium group also serves as an atom forming the ring. In this case, the nitrogen atom forming the ring and the silicon atom are bonded directly or via a divalent linking group, or the carbon atom forming the ring and the silicon atom are bonded directly or via a divalent linking group.

In one preferred embodiment of the present invention, $R^{31}$ is a heteroaromatic cyclic ammonium group of the following Formula (Si).

(S1)

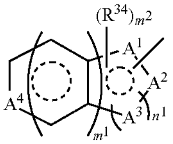

$A^1$, $A^2$, $A^3$, and $A^4$ are each independently a group of any of the following Formulae (J1) to (J3), and at least one of $A^1$ to $A^4$ is a group of the following Formula (J2). Depending on the bonding between a silicon atom in Formula (4) and any of $A^1$ to $A^4$, each of $A^1$ to $A^4$ and the ring-forming atom adjacent thereto forms a single bond or a double bond. This determines whether the thus-formed ring exhibits aromaticity.

(J1)

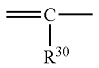

(J2)

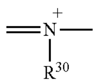

(J3)

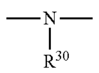

$R^{30}$ is each independently a single bond, a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

$R^{34}$ is each independently an alkyl group, an aryl group, an aralkyl group, a halogenated alkyl group, a halogenated aryl group, a halogenated aralkyl group, an alkenyl group, or a hydroxy group. When two or more $R^{34}$s are present, the two $R^{34}$s may be bonded together to form a ring, and the ring formed by the two $R^{34}$s may have a crosslinked ring structure. In such a case, the cyclic ammonium group has, for example, an adamantane ring, a norbornene ring, or a spiro ring.

Specific examples of these alkyl group, aryl group, aralkyl group, halogenated alkyl group, halogenated aryl group, halogenated aralkyl group, and alkenyl group, and preferred carbon atom numbers thereof are the same as those described above.

$n^1$ is an integer of 1 to 8; $m^1$ is 0 or 1; and $m^2$ is 0 or a positive integer ranging from 1 to the possible maximum number of $R^{34}$s substituted on a monocyclic or polycyclic ring.

When $m^1$ is 0, a $(4+n^1)$-membered ring including $A^1$ to $A^4$ is formed. Specifically, when $n^1$ is 1, a 5-membered ring is formed; when $n^1$ is 2, a 6-membered ring is formed; when $n^1$ is 3, a 7-membered ring is formed; when $n^1$ is 4, an 8-membered ring is formed; when $n^1$ is 5, a 9-membered ring is formed; when $n^1$ is 6, a 10-membered ring is formed; when $n^1$ is 7, an 11-membered ring is formed; and when $n^1$ is 8, a 12-membered ring is formed.

When $m^1$ is 1, a fused ring is formed by condensation between a $(4+n^1)$-membered ring including $A^1$ to $A^3$ and a 6-membered ring including $A^4$.

Since each of $A^1$ to $A^4$ is any of the groups of Formulae (J1) to (J3), the ring-forming atom has or does not have a hydrogen atom. In each of $A^1$ to $A^4$, when the ring-forming atom has a hydrogen atom, the hydrogen atom may be substituted with $R^{34}$. Alternatively, a ring-forming atom other than the ring-forming atom in each of $A^1$ to $A^4$ may be substituted with $R^{34}$. Because of these circumstances, $m^2$ is 0 or an integer ranging from 1 to the possible maximum number of $R^{34}$s substituted on a monocyclic or polycyclic ring.

The bonding hand of the heteroaromatic cyclic ammonium group of Formula (51) is present on any carbon atom or nitrogen atom present in such a monocyclic or fused ring, and is directly bonded to a silicon atom. Alternatively, the bonding hand is bonded to a linking group to form an organic group containing the cyclic ammonium, and the organic group is bonded to a silicon atom.

Examples of the linking group include, but are not limited to, an alkylene group, an arylene group, and an alkenylene group.

Specific examples of the alkylene group and the arylene group, and preferred carbon atom numbers thereof are the same as those described above.

The alkenylene group is a divalent group derived from an alkenyl group through removal of one hydrogen atom. Specific examples of the alkenyl group are the same as those described above. No particular limitation is imposed on the carbon atom number of the alkenylene group, but the carbon atom number is preferably 40 or less, more preferably 30 or less, still more preferably 20 or less.

Specific examples of the alkenylene group include, but are not limited to, vinylene group, 1-methylvinylene group, propenylene group, 1-butenylene group, 2-butenylene group, 1-pentenylene group, and 2-pentenylene group.

Specific examples of the hydrolyzable organosilane of Formula (4) having the heteroaromatic cyclic ammonium group of Formula (51) include, but are not limited to, those described below.

Formula (I-1)

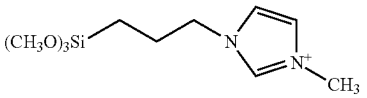

-continued
Formula (I-2)
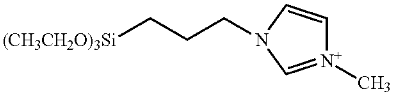
Formula (I-3)
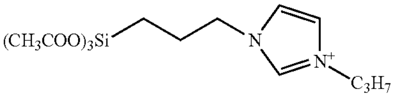
Formula (I-4)
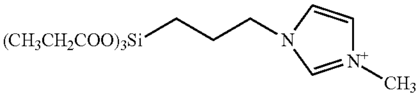
Formula (I-5)
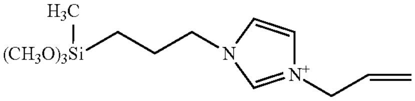
Formula (I-6)
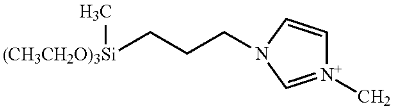
Formula (I-7)
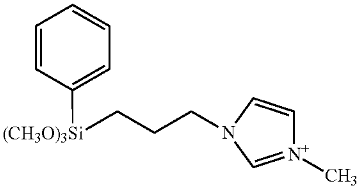
Formula (I-8)
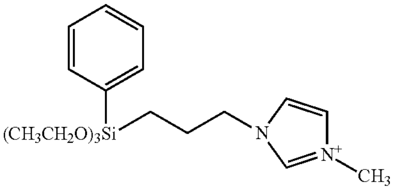
Formula (I-9)
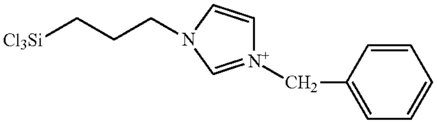
Formula (I-10)
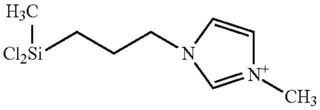
Formula (I-12)
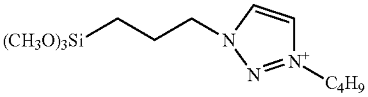
Formula (I-13)
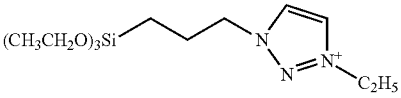
-continued
Formula (I-14)
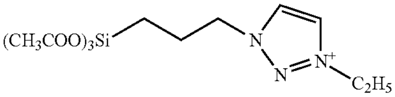
Formula (I-15)
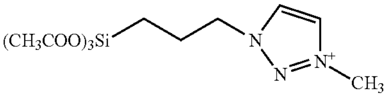
Formula (I-16)
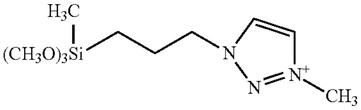
Formula (I-17)
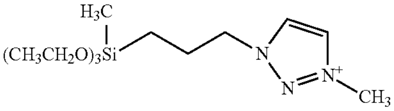
Formula (I-18)
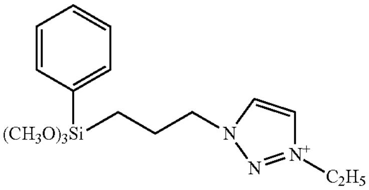
Formula (I-19)
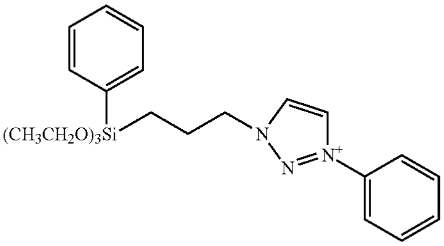
Formula (I-20)
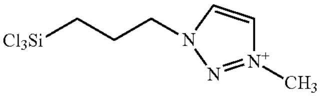
Formula (I-21)
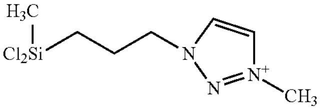
Formula (I-22)
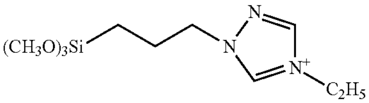
Formula (I-23)
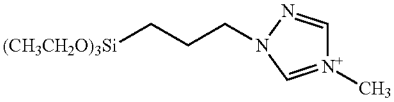
Formula (I-24)
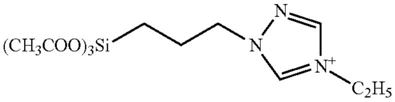

-continued
Formula (I-25)
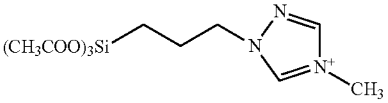
Formula (I-26)
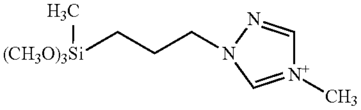
Formula (I-27)
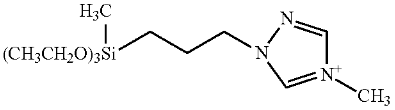
Formula (I-28)
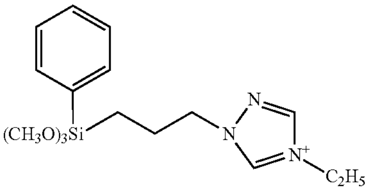
Formula (I-29)
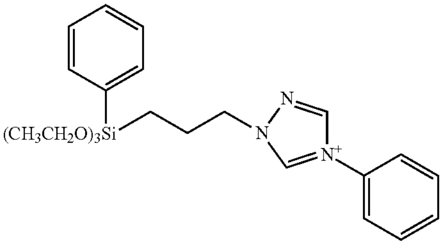
Formula (I-30)
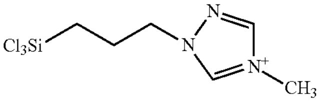
Formula (I-31)
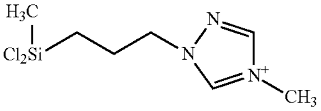
Formula (I-32)
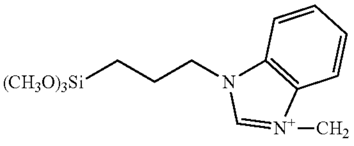
Formula (I-33)
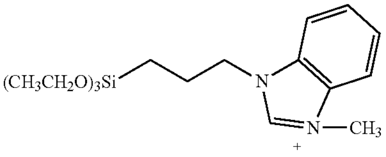
Formula (I-34)
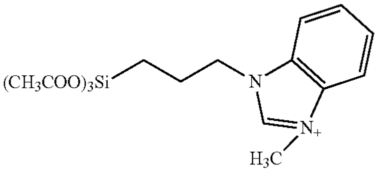
-continued
Formula (I-35)
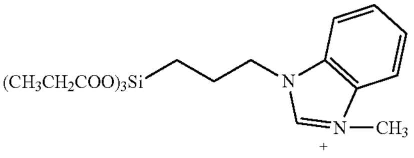
Formula (I-36)
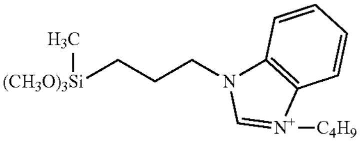
Formula (I-37)
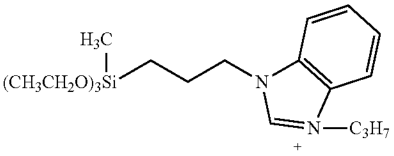
Formula (I-38)
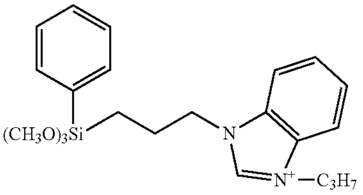
Formula (I-39)
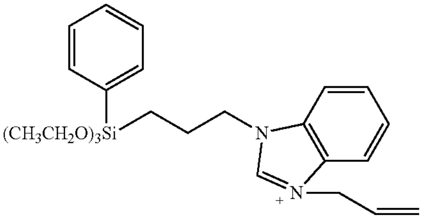
Formula (I-40)
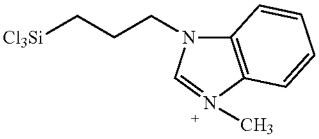
Formula (I-41)
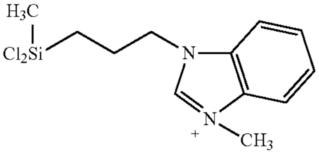
Formula (I-71)
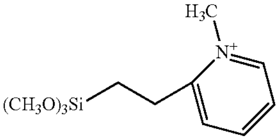
Formula (I-72)
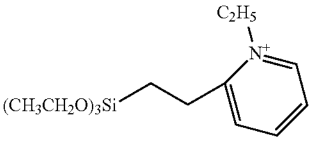

-continued

Formula (I-73)

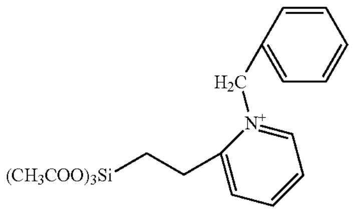

Formula (I-74)

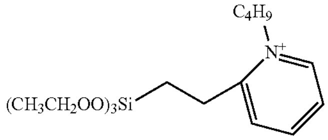

Formula (I-75)

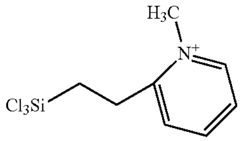

Formula (I-76)

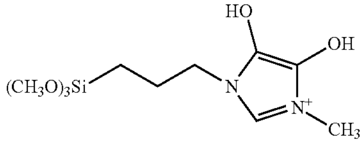

Formula (I-77)

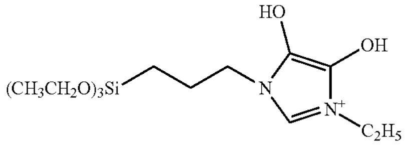

Formula (I-78)

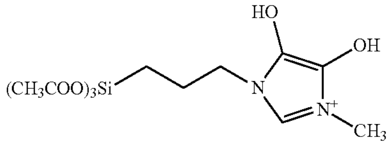

Formula (I-79)

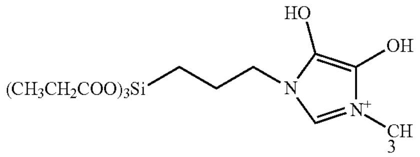

Formula (I-80)

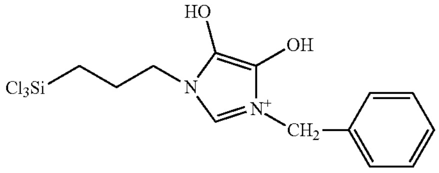

In another preferred embodiment of the present invention, $R^{31}$ is a heteroaliphatic cyclic ammonium group of the following Formula (S2).

(S2)

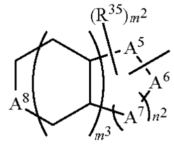

$A^5$, $A^6$, $A^7$, and $A^8$ are each independently a group of any of the following Formulae (J4) to (J6), and at least one of $A^5$ to $A^8$ is a group of the following Formula (J5). Depending on the bonding between a silicon atom in Formula (4) and any of $A^5$ to $A^8$, each of $A^5$ to $A^8$ and the ring-forming atom adjacent thereto forms a single bond or a double bond. This determines whether the thus-formed ring exhibits anti-aromaticity.

(J4)

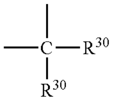

(J5)

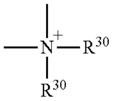

(J6)

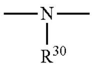

$R^{30}$ is each independently a single bond, a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

$R^{35}$ is each independently an alkyl group, an aryl group, an aralkyl group, a halogenated alkyl group, a halogenated aryl group, a halogenated aralkyl group, an alkenyl group, or a hydroxy group. When two or more $R^{35}$s are present, the two $R^{35}$s may be bonded together to form a ring, and the ring formed by the two $R^{35}$s may have a crosslinked ring structure. In such a case, the cyclic ammonium group has, for example, an adamantane ring, a norbornene ring, or a Spiro ring.

Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

$n^2$ is an integer of 1 to 8; $m^3$ is 0 or 1; and $m^4$ is 0 or a positive integer ranging from 1 to the possible maximum number of $R^{35}$s substituted on a monocyclic or polycyclic ring.

When $m^3$ is 0, a $(4+n^2)$-membered ring including $A^5$ to $A^8$ is formed. Specifically, when $n^2$ is 1, a 5-membered ring is formed; when $n^2$ is 2, a 6-membered ring is formed; when $n^2$ is 3, a 7-membered ring is formed; when $n^2$ is 4, an 8-membered ring is formed; when $n^2$ is 5, a 9-membered ring is formed; when $n^2$ is 6, a 10-membered ring is formed;

when $n^2$ is 7, an 11-membered ring is formed; and when $n^2$ is 8, a 12-membered ring is formed.

When $m^3$ is 1, a fused ring is formed by condensation between a $(4+n^2)$-membered ring including $A^5$ to $A^7$ and a 6-membered ring including $A^8$.

Since each of $A^5$ to $A^8$ is any of the groups of Formulae (J4) to (J6), the ring-forming atom has or does not have a hydrogen atom. In each of $A^5$ to $A^8$, when the ring-forming atom has a hydrogen atom, the hydrogen atom may be substituted with $R^{35}$. Alternatively, a ring-forming atom other than the ring-forming atom in each of $A^5$ to $A^8$ may be substituted with $R^{35}$.

Because of these circumstances, $m^4$ is 0 or an integer ranging from 1 to the possible maximum number of $R^{35}$s substituted on a monocyclic or polycyclic ring.

The bonding hand of the heteroaliphatic cyclic ammonium group of Formula (S2) is present on any carbon atom or nitrogen atom present in such a monocyclic or fused ring, and is directly bonded to a silicon atom. Alternatively, the bonding hand is bonded to a linking group to form an organic group containing the cyclic ammonium group, and the organic group is bonded to a silicon atom.

The linking group is, for example, an alkylene group, an arylene group, or an alkenylene group. Specific examples of the alkylene group, the arylene group, and the alkenylene group, and preferred carbon atom numbers thereof are the same as those described above.

Specific examples of the hydrolyzable organosilane of Formula (4) having the heteroaliphatic cyclic ammonium group of Formula (S2) include, but are not limited to, those described below.

Formula (II-1)

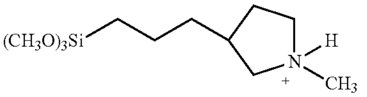

Formula (II-2)

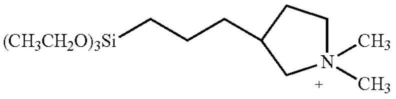

Formula (II-3)

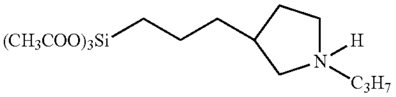

Formula (II-4)

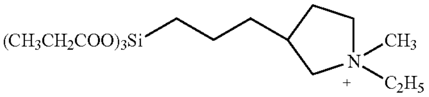

Formula (II-5)

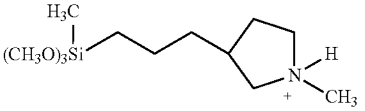

Formula (II-6)

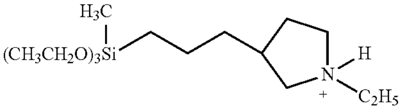

-continued

Formula (II-7)

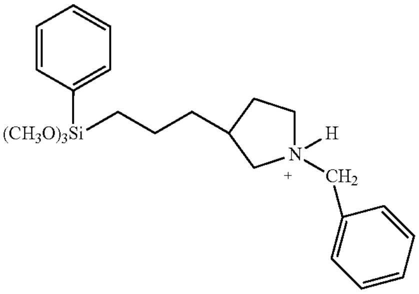

Formula (II-8)

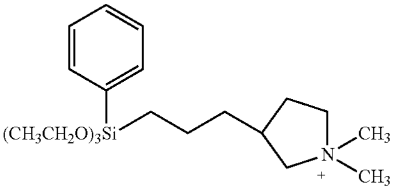

Formula (II-9)

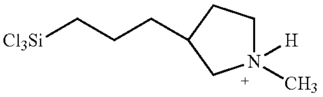

Formula (II-10)

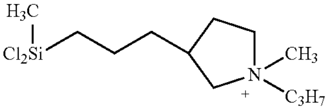

Formula (II-12)

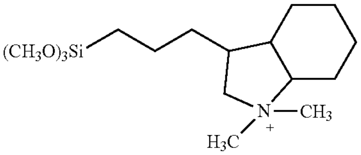

Formula (II-13)

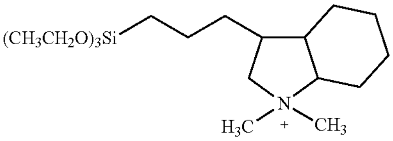

Formula (II-14)

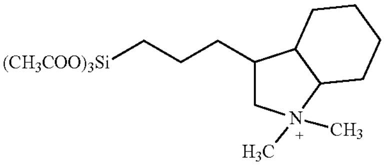

Formula (II-15)

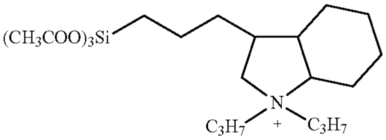

Formula (II-16)

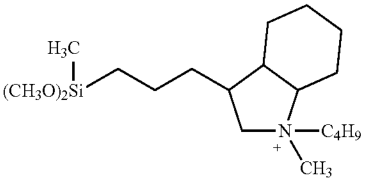

-continued

Formula (II-17)

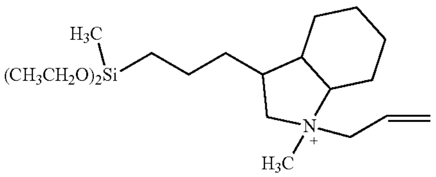

Formula (II-18)

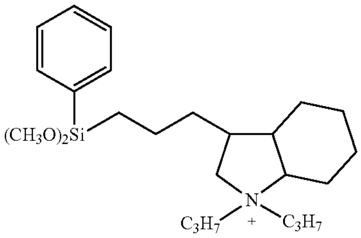

Formula (II-19)

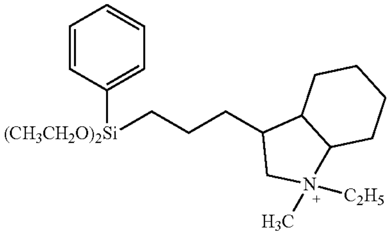

Formula (II-20)

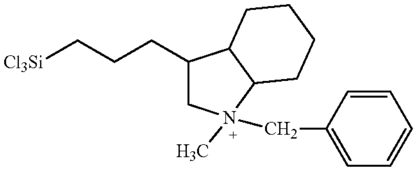

Formula (II-21)

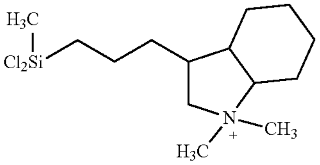

Formula (II-22)

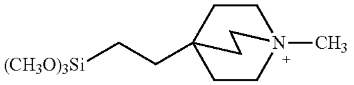

Formula (II-23)

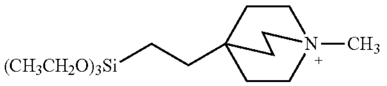

Formula (II-24)

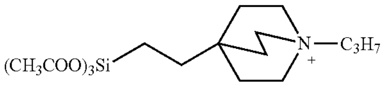

Formula (II-25)

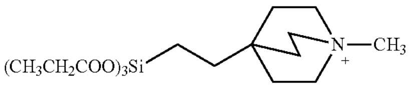

Formula (II-26)

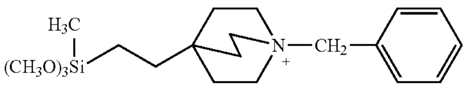

-continued

Formula (II-27)

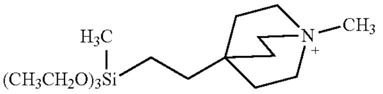

Formula (II-28)

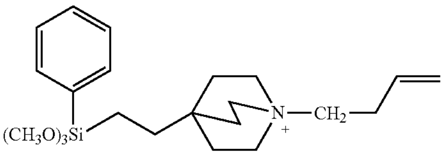

Formula (II-29)

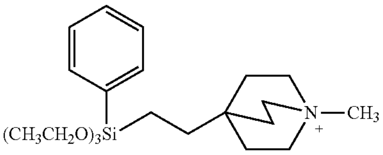

Formula (II-30)

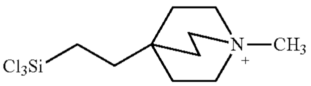

Formula (II-31)

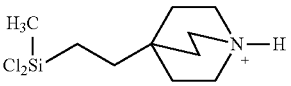

In another preferred embodiment of the present invention, $R^3$ is a chain ammonium group of the following Formula (S3).

(S3)

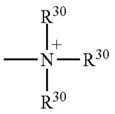

$R^{30}$ is each independently a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

The chain ammonium group of Formula (S3) is directly bonded to a silicon atom. Alternatively, the chain ammonium group is bonded to a linking group to form an organic group containing the chain ammonium group, and the organic group is bonded to a silicon atom.

The linking group is, for example, an alkylene group, an arylene group, or an alkenylene group. Specific examples of the alkylene group, the arylene group, and the alkenylene group are the same as those described above.

Specific examples of the hydrolyzable organosilane of Formula (4) having the chain ammonium group of Formula (S3) include, but are not limited to, those described below.

Formula (III-1)

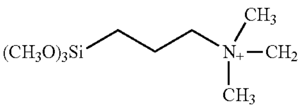

-continued
Formula (III-2)
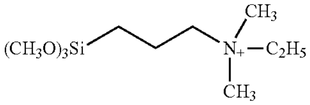
Formula (III-3)
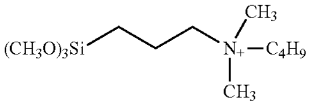
Formula (III-4)
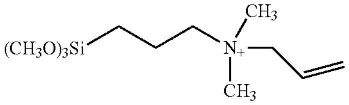
Formula (III-5)
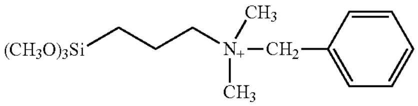
Formula (III-6)
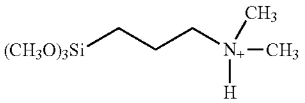
Formula (III-7)
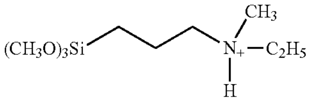
Formula (III-8)
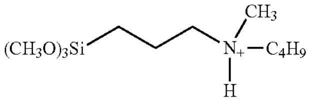
Formula (III-9)
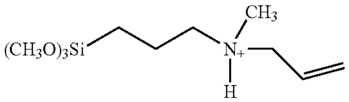
Formula (III-10)
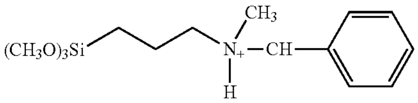
Formula (III-11)
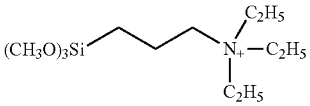
Formula (III-12)
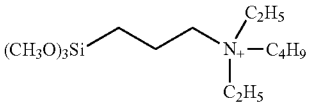
Formula (III-13)
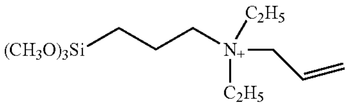
Formula (III-14)
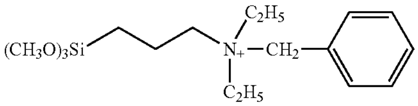
-continued
Formula (III-15)
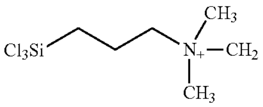
Formula (III-16)
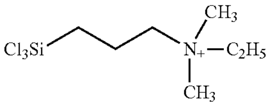
Formula (III-17)
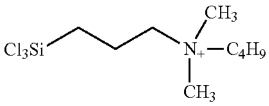
Formula (III-18)
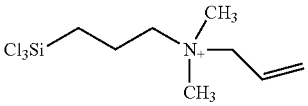
Formula (III-19)
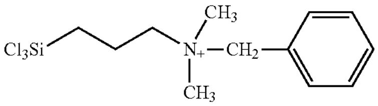
Formula (III-20)
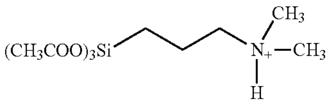
Formula (III-21)
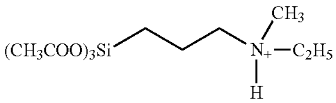
Formula (III-22)
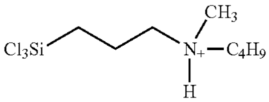
Formula (III-23)
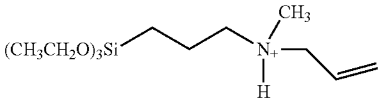
Formula (III-24)
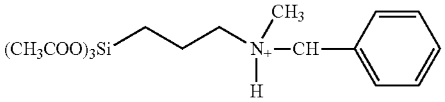
Formula (III-25)
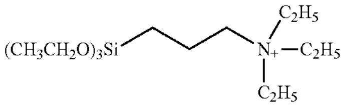
Formula (III-26)
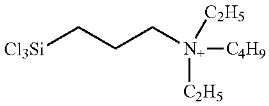
Formula (III-27)
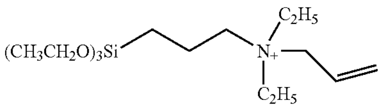

-continued

Formula (III-28)

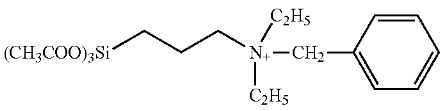

The film-forming composition of the present invention may further contain, as a hydrolyzable silane, a silane having a sulfone group or a silane having a sulfonamide group.

Specific examples of such a silane include, but are not limited to, those described below.

Formula (B-1)

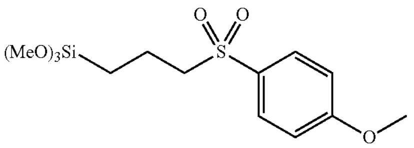

Formula (B-2)

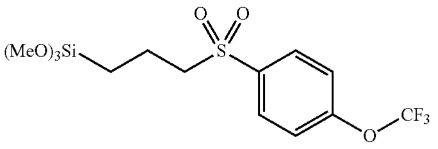

Formula (B-3)

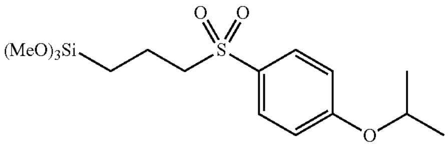

Formula (B-4)

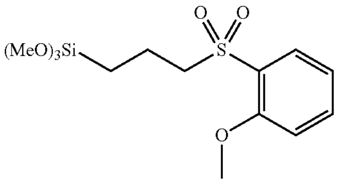

Formula (B-5)

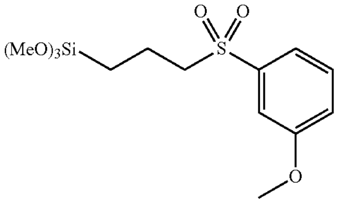

Formula (B-6)

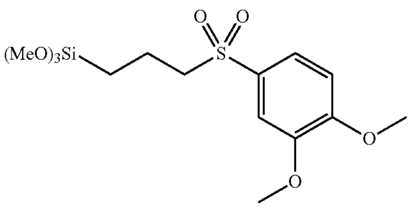

-continued

Formula (B-7)

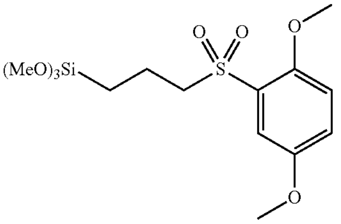

Formula (B-8)

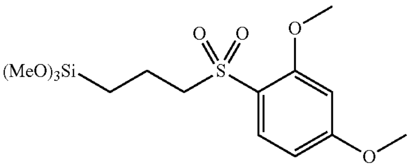

Formula (B-9)

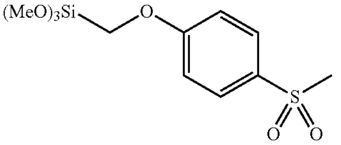

Formula (B-10)

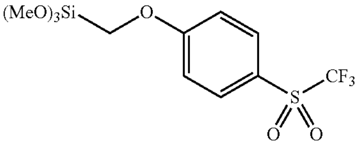

Formula (B-11)

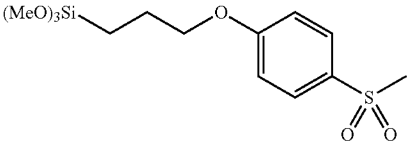

Formula (B-12)

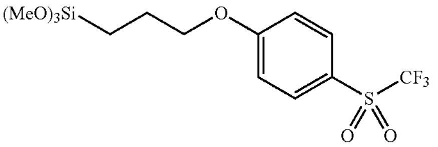

Formula (B-13)

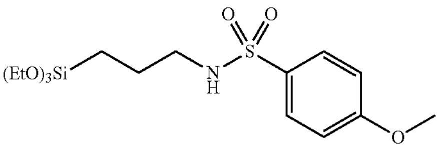

Formula (B-14)

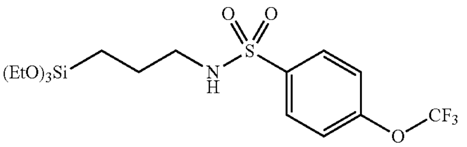

Formula (B-15)

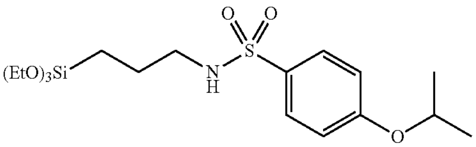

-continued
Formula (B-16)
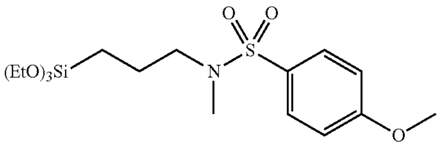
Formula (B-17)
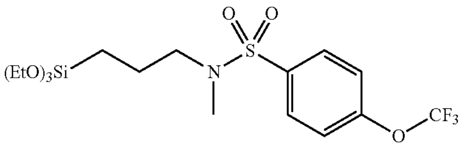
Formula (B-18)
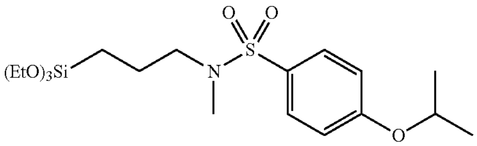
Formula (B-19)
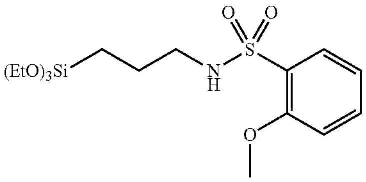
Formula (B-20)
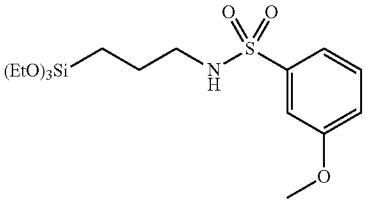
Formula (B-21)
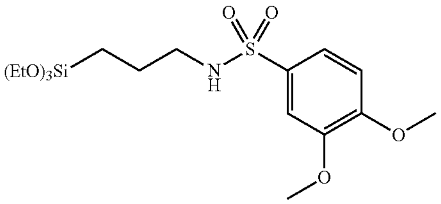
Formula (B-22)
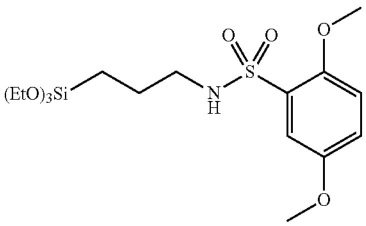
Formula (B-23)
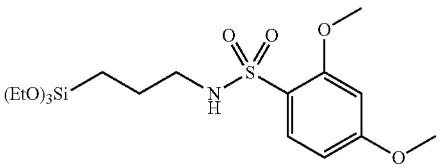
-continued
Formula (B-24)
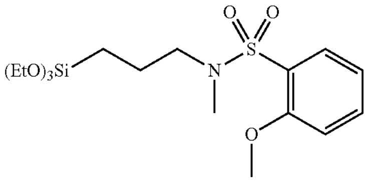
Formula (B-25)
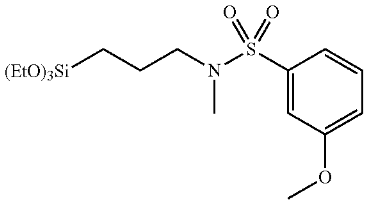
Formula (B-26)
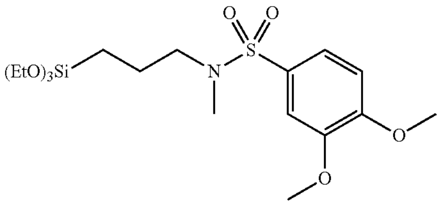
Formula (B-27)
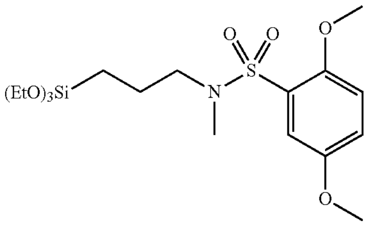
Formula (B-28)
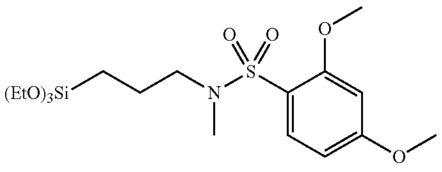
Formula (B-29)
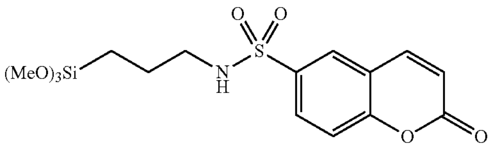
Formula (B-30)
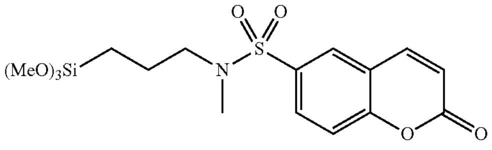

-continued

Formula (B-31)

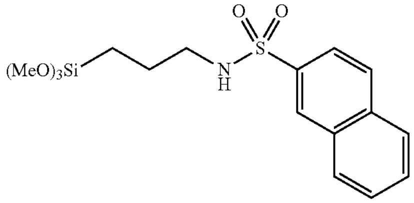

Formula (B-32)

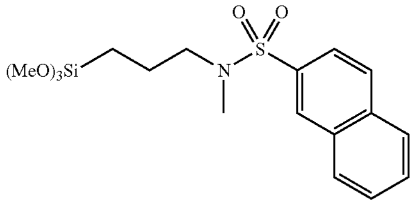

Formula (B-33)

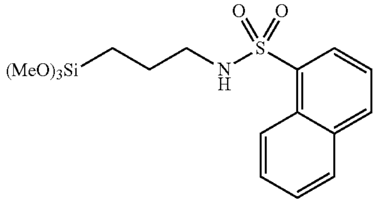

Formula (B-34)

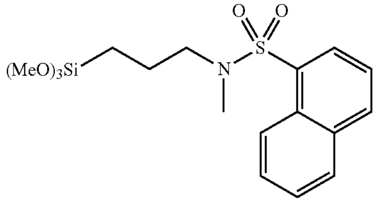

Formula (B-35)

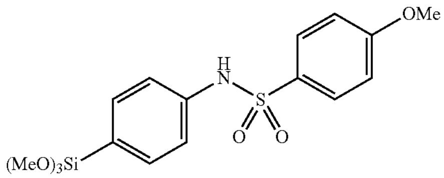

Formula (B-36)

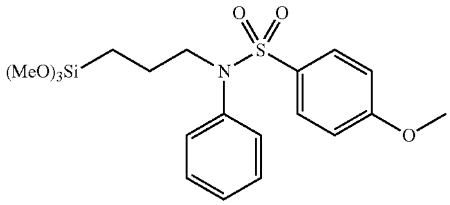

In one preferred embodiment of the present invention, the film-forming composition of the present invention contains at least a hydrolysis condensate of the aforementioned hydrolyzable silane.

In one preferred embodiment of the present invention, the hydrolysis condensate contained in the film-forming composition of the present invention contains a hydrolysis condensate (polyorganosiloxane) prepared from at least the hetero-ring-containing silane of Formula (1) and the additional silane of Formula (2). In one more preferred embodiment of the present invention, the hydrolysis condensate contained in the film-forming composition of the present invention is a hydrolysis condensate (polyorganosiloxane) prepared from at least the hetero-ring-containing silane of Formula (1) and the additional silane of Formula (2).

In the present invention, the hydrolysis condensate (polyorganosiloxane) generally has a weight average molecular weight of 500 to 1,000,000. From the viewpoint of, for example, preventing the precipitation of the hydrolysis condensate in the composition, the weight average molecular weight is preferably 500,000 or less, more preferably 250,000 or less, still more preferably 100,000 or less. From the viewpoint of, for example, the compatibility between storage stability and applicability, the weight average molecular weight is preferably 700 or more, more preferably 1,000 or more.

The weight average molecular weight is determined by GPC analysis in terms of polystyrene. The GPC analysis can be performed under, for example, the following conditions: GPC apparatus (trade name: HLC-8220GPC, available from Tosoh Corporation), GPC columns (trade name: Shodex KF803L, KF802, and KF801, available from Showa Denko K.K.), a column temperature of 40° C., tetrahydrofuran serving as an eluent (elution solvent), a flow amount (flow rate) of 1.0 mL/min, and polystyrene (available from Showa Denko K.K.) as a standard sample.

The film-forming composition of the present invention may contain an organic acid, water, an alcohol, etc. for the purpose of, for example, stabilizing the hydrolysis condensate.

Specific examples of the organic acid that may be contained in the film-forming composition of the present invention for the aforementioned purpose include, but are not limited to, oxalic acid, malonic acid, methylmalonic acid, succinic acid, maleic acid, malic acid, tartaric acid, phthalic acid, citric acid, glutaric acid, lactic acid, and salicylic acid. Of these, oxalic acid or maleic acid is preferred.

When the film-forming composition of the present invention contains an organic acid, the amount of the organic acid is 0.1 to 5.0% by mass relative to the total mass of the hydrolyzable silane, a hydrolysate of the silane, and a hydrolysis condensate of the silane.

The alcohol that may be contained in the film-forming composition of the present invention for the aforementioned purpose is preferably an alcohol that easily evaporates by heating after the application of the composition. Specific examples of the alcohol include lower aliphatic alcohols, such as methanol, ethanol, propanol, isopropanol, and butanol.

When the film-forming composition of the present invention contains an alcohol, the amount of the alcohol is 1 to 20 parts by mass relative to 100 parts by mass of the composition.

The film-forming composition of the present invention may optionally contain, for example, an organic polymer compound, a photoacid generator, or a surfactant.

The organic polymer compound that may be contained in the film-forming composition of the present invention is appropriately selected from various organic polymers (polycondensation polymer and addition polymerization polymer) in accordance with the purpose of addition of the organic polymer compound.

Specific examples of the organic polymer compound include addition polymerization polymers and polycondensation polymers, such as polyester, polystyrene, polyimide, acrylic polymer, methacrylic polymer, polyvinyl ether, phenol novolac, naphthol novolac, polyether, polyamide, and polycarbonate.

In the present invention, an organic polymer having an aromatic or heteroaromatic ring that functions as a light-absorbing moiety (e.g., a benzene ring, a naphthalene ring, an anthracene ring, a triazine ring, a quinoline ring, or a quinoxaline ring) can also be suitably used in the case where such a function is required. Specific examples of such an organic polymer compound include, but are not limited to, addition polymerization polymers containing, as structural units, addition polymerizable monomers (e.g., benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide); and polycondensation polymers such as phenol novolac and naphthol novolac.

When an addition polymerization polymer is used as an organic polymer compound, the polymer compound may be a homopolymer or a copolymer.

An addition polymerizable monomer is used for the production of the addition polymerization polymer. Specific examples of the addition polymerizable monomer include, but are not limited to, acrylic acid, methacrylic acid, an acrylate ester compound, a methacrylate ester compound, an acrylamide compound, a methacrylamide compound, a vinyl compound, a styrene compound, a maleimide compound, maleic anhydride, and acrylonitrile.

Specific examples of the acrylate ester compound include, but are not limited to, methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Specific examples of the methacrylate ester compound include, but are not limited to, methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Specific examples of the acrylamide compound include, but are not limited to, acrylamide, N-methylacrylamide, N-ethylacrylamide, N-benzylacrylamide, N-phenylacrylamide, N,N-dimethylacrylamide, and N-anthrylacrylamide.

Specific examples of the methacrylamide compound include, but are not limited to, methacrylamide, N-methylmethacrylamide, N-ethylmethacrylamide, N-benzylmethacrylamide, N-phenylmethacrylamide, N,N-dimethylmethacrylamide, and N-anthrylmethacrylamide.

Specific examples of the vinyl compound include, but are not limited to, vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Specific examples of the styrene compound include, but are not limited to, styrene, hydroxy styrene, chlorostyrene, bromostyrene, methoxy styrene, cyanostyrene, and acetylstyrene.

Examples of the maleimide compound include, but are not limited to, maleimide, N-methylmaleimide, N-phenylmaleimide, N-cyclohexylmaleimide, N-benzylmaleimide, and N-hydroxyethylmaleimide.

When a polycondensation polymer is used as a polymer, the polymer is, for example, a polycondensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polymer include, but are not limited to, polyesters, polyamides, and polyimides, such as polypyromellitimide, poly(p-phenyleneterephthalamide), polybutylene terephthalate, and polyethylene terephthalate.

When the organic polymer compound contains a hydroxy group, the hydroxy group can be crosslinked with, for example, a hydrolysis condensate.

The organic polymer compound that may be contained in the film-forming composition of the present invention generally has a weight average molecular weight of 1,000 to 1,000,000. From the viewpoint of, for example, preventing the precipitation of the polymer compound in the composition, the weight average molecular weight is preferably 300,000 or less, more preferably 200,000 or less, still more preferably 100,000. From the viewpoint of, for example, sufficiently achieving the functional effect of the polymer, the weight average molecular weight is preferably 3,000 or more, more preferably 5,000 or more, still more preferably 10,000 or more.

These organic polymer compounds may be used alone or in combination of two or more species.

When the film-forming composition of the present invention contains an organic polymer compound, the amount of the organic polymer compound cannot be univocally determined, since the amount should be appropriately determined in consideration of, for example, the function of the organic polymer compound. The amount of the organic polymer compound is generally 1 to 200% by mass relative to the total mass of the hydrolyzable silane, a hydrolysate of the silane, and a hydrolysis condensate of the silane. From the viewpoint of, for example, preventing the precipitation of the polymer compound in the composition, the amount is preferably 100% by mass or less, more preferably 50% by mass or less, still more preferably 30% by mass or less. From the viewpoint of, for example, sufficiently achieving the effect of the polymer compound, the amount is preferably 5% by mass or more, more preferably 10% by mass or more, still more preferably 30% by mass or more.

Examples of the acid generator include a thermal acid generator and a photoacid generator.

Examples of the photoacid generator include, but are not limited to, an onium salt compound, a sulfonimide compound, and a disulfonyldiazomethane compound.

Specific examples of the onium salt compound include, but are not limited to, iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-t-butylphenyl)iodonium camphorsulfonate, and bis(4-t-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Specific examples of the sulfonimide compound include, but are not limited to, N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy)naphthalimide.

Specific examples of the disulfonyldiazomethane compound include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These acid generators may be used alone or in combination of two or more species.

When the film-forming composition of the present invention contains an acid generator, the amount of the acid generator cannot be univocally determined, since the amount should be appropriately determined in consideration of, for example, the type of the acid generator. The amount of the acid generator is generally 0.01 to 5% by mass relative to the total mass of the hydrolyzable silane, a hydrolysate of the silane, and a hydrolysis condensate of the silane. From the viewpoint of, for example, preventing the precipitation of the acid generator in the composition, the amount is preferably 3% by mass or less, more preferably 1% by mass or less. From the viewpoint of, for example, sufficiently achieving the effect of the acid generator, the amount is preferably 0.1% by mass or more, more preferably 0.5% by mass or more.

A surfactant particularly effectively prevents formation of, for example, pinholes and striations during application, to a substrate, of the film-forming composition of the present invention as a resist underlayer film-forming composition for lithography.

Specific examples of the surfactant include, but are not limited to, nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as trade names EFTOP EF301, EF303, and EF352 (available from Tohkem Products Corporation), trade names MEGAFAC F171, F173, R-08, R-30, R-30N, and R-40LM (available from DIC Corporation), Fluorad FC430 and FC431 (available from Sumitomo 3M Limited), trade name Asahi Guard AG710 and trade names SURFLON S-382, SC101, SC102, SC103, SC104, SC105, and SC106 (available from AGC Inc.); and Organosiloxane Polymer KP341 (available from Shin-Etsu Chemical Co., Ltd.).

These surfactants may be used alone or in combination of two or more species.

When the film-forming composition of the present invention contains a surfactant, the amount of the surfactant is generally 0.0001 to 5 parts by mass relative to 100 parts by mass of the condensate (polyorganosiloxane). From the viewpoint of, for example, preventing the precipitation of the surfactant in the composition, the amount is preferably 1 part by mass or less. From the viewpoint of, for example, sufficiently achieving the effect of the surfactant, the amount is preferably 0.001 parts by mass or more, more preferably 0.01 parts by mass or more.

The film-forming composition of the present invention may also contain, for example, a rheology controlling agent, an adhesion aid, or a curing catalyst. A rheology controlling agent is effective for improving the fluidity of the film-forming composition. An adhesion aid is effective for improving the adhesion between a semiconductor substrate or a resist and an Si-containing resist underlayer film formed from the composition of the present invention. A curing catalyst is effective for curing the film. Specific examples of the curing catalyst include, but are not limited to, sulfonium salt compounds, such as triphenylsulfonium nitrate, triphenylsulfonium maleate, triphenylsulfonium trifluoroacetate, triphenylsulfonium hydrochloride, and triphenylsulfonium acetate.

The hydrolysate or hydrolysis condensate used in the present invention can be produced through hydrolysis of the aforementioned hydrolyzable silane.

The hydrolysis may be completely or partially performed. As described above, the hydrolysis condensate contained in the film-forming composition of the present invention may contain a partial hydrolysate together with a complete hydrolysate. The hydrolyzable silane (i.e., monomer) may remain in the composition.

The hydrolyzable silane used in the present invention has an alkoxy group, aralkyloxy group, acyloxy group, or halogen atom directly bonded to the silicon atom, and contains a hydrolyzable group (i.e., an alkoxysilyl group, an aralkyloxysilyl group, an acyloxysilyl group, or a halogenated silyl group). For the hydrolysis of the hydrolyzable silane, generally 0.5 to 100 mol (preferably 1 to 10 mol) of water is used per mol of the hydrolyzable group.

During the hydrolysis, a hydrolysis catalyst may be used for the purpose of, for example, promoting the hydrolysis.

Specific examples of the hydrolysis catalyst include, but are not limited to, a metal chelate compound, an organic acid, an inorganic acid, an organic base, and an inorganic base.

A single hydrolysis catalyst may be used alone, or two or more hydrolysis catalysts may be used in combination. The amount of the hydrolysis catalyst used is generally 0.001 to 10 mol, preferably 0.001 to 1 mol, per mol of the hydrolyzable group.

Specific examples of the metal chelate compound include, but are not limited to, titanium chelate compounds, such as triethoxy•mono(acetylacetonato)titanium, tri-n-propoxy•mono(acetylacetonato)titanium, tri-isopropoxy•mono(acetylacetonato)titanium, tri-n-butoxy•mono(acetylacetonato)titanium, tri-s-butoxy•mono(acetylacetonato)titanium, tri-t-butoxy•mono(acetylacetonato)titanium, diethoxy•bis(acetylacetonato)titanium, di-n-propoxy•bis(acetylacetonato)titanium, di-isopropoxy•bis(acetylacetonato)titanium, di-n-butoxy•bis(acetylacetonato)titanium, di-s-butoxy•bis(acetylacetonato)titanium, di-t-butoxy•bis(acetylacetonato)titanium, monoethoxy•tris(acetylacetonato)titanium, mono-n-propoxy•tris(acetylacetonato)titanium, mono-isopropoxy•tris(acetylacetonato)titanium, mono-n-butoxy•tris(acetylacetonato)titanium, mono-s-butoxy•tris(acetylacetonato)titanium, mono-t-butoxy•tris(acetylacetonato)titanium, tetrakis(acetylacetonato)titanium, tiethoxy•mono(ethylacetoacetato)titanium, tri-n-propoxy•mono(ethylacetoacetato)titanium, tri-isopropoxy•mono(ethylacetoacetato)titanium, tri-n-butoxy•mono(ethylacetoacetato)titanium, tri-s-butoxy•mono(ethylacetoacetato)titanium, tri-t-butoxy•mono(ethylacetoacetato)titanium, diethoxy•bis(ethylacetoacetato)titanium, di-n-propoxy•bis(ethylacetoacetato)titanium, di-isopropoxy•bis(ethylacetoacetato)titanium, di-n-butoxy•bis(ethylacetoacetato)titanium, di-s-butoxy•bis(ethylacetoacetato)titanium, di-t-butoxy•bis(ethylacetoacetato)titanium, monoethoxy•tris(ethylacetoacetato)titanium, mono-n-propoxy•tris(ethylacetoacetato)titanium, mono-isopropoxy•tris(ethylacetoacetato)titanium, mono-n-butoxy•tris(ethylacetoacetato)titanium, mono-s-butoxy•tris(ethylacetoacetato)titanium, mono-t-butoxy•tris(ethylacetoacetato)titanium, tetrakis(ethylacetoacetato)titanium, mono(acetylacetonato)tris(ethylacetoacetato)titanium, bis(acetylacetonato)bis(ethylacetoacetato)titanium, and tris(acetylacetonato)mono(ethylacetoacetato)titanium; zirconium chelate compounds, such as triethoxy•mono(acetylacetonato)zirconium, tri-n-propoxy•mono(acetylacetonato)zirconium, tri-isopropoxy•mono(acetylacetonato)zirconium, tri-n-butoxy•mono(acetylacetonato)zirconium, tri-s-butoxy•mono(acetylacetonato)zirconium, tri-t-butoxy•mono(acetylacetonato)zirconium, diethoxy•bis(acetylacetonato)zirconium, di-n-propoxy•bis(acetylacetonato)zirconium, di-isopropoxy•bis(acetylacetonato)zirconium, di-n-butoxy•bis(acetylacetonato)zirconium, di-s-butoxy•bis(acetylacetonato)zirconium, di-t-butoxy•bis(acetylacetonato)zirconium, monoethoxy•tris(acetylacetonato)zirconium, mono-n-propoxy•tris(acetylacetonato)zirconium, mono-isopropoxy•tris(acetylacetonato)zirconium, mono-n-butoxy•tris(acetylacetonato)zirconium, mono-s-butoxy•tris(acetylacetonato)zirconium, mono-t-butoxy•tris(acetylacetonato)zirconium, tetrakis(acetylacetonato)zirconium, triethoxy•mono(ethylacetoacetato)zirconium, tri-n-propoxy•mono(ethylacetoacetato)zirconium, tri-isopropoxy•mono(ethylacetoacetato)zirconium, tri-n-butoxy•mono(ethylacetoacetato)zirconium, tri-s-butoxy•mono(ethylacetoacetato)zirconium, tri-t-butoxy•mono(ethylacetoacetato)zirconium, diethoxy•bis(ethylacetoacetato)zirconium, di-n-propoxy•bis(ethylacetoacetato)zirconium, di-isopropoxy•bis(ethylacetoacetato)zirconium, di-n-butoxy•bis(ethylacetoacetato)zirconium, di-s-butoxy•bis(ethylacetoacetato)zirconium, di-t-butoxy•bis(ethylacetoacetato)zirconium, monoethoxy•tris(ethylacetoacetato)zirconium, mono-n-propoxy•tris(ethylacetoacetato)zirconium, mono-isopropoxy•tris(ethylacetoacetato)zirconium, mono-n-butoxy•tris(ethylacetoacetato)zirconium, mono-s-butoxy•tris(ethylacetoacetato)zirconium, mono-t-butoxy•tris(ethylacetoacetato)zirconium, tetrakis(ethylacetoacetato)zirconium, mono(acetylacetonato)tris(ethylacetoacetato)zirconium, bis(acetylacetonato)bis(ethylacetoacetato)zirconium, and tris(acetylacetonato)mono(ethylacetoacetato)zirconium; and aluminum chelate compounds, such as tris(acetylacetonato)aluminum and tris(ethylacetoacetato)aluminum.

Specific examples of the organic acid include, but are not limited to, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Specific examples of the inorganic acid include, but are not limited to, hydrochloric acid, nitric acid, sulfuric acid, hydrofluoric acid, and phosphoric acid.

Specific examples of the organic base include, but are not limited to pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, trimethylphenylammonium hydroxide, benzyltrimethylammonium hydroxide, and benzyltriethylammonium hydroxide.

Specific examples of the inorganic base include, but are not limited to, ammonia, sodium hydroxide, potassium hydroxide, barium hydroxide, and calcium hydroxide.

Among the above-exemplified hydrolysis catalysts, a metal chelate compound, an organic acid, or an inorganic acid is preferred.

The hydrolysis may involve the use of an organic solvent. Specific examples of the organic solvent include, but are not limited to, aliphatic hydrocarbon solvents, such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents, such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monohydric alcohol solvents, such as methanol, ethanol, n-propanol, isopropanol, n-butanol, isobutanol, s-butanol, t-butanol, n-pentanol, isopentanol, 2-methylbutanol, s-pentanol, t-pentanol, 3-methoxybutanol, n-hexanol, 2-methylpentanol, s-hexanol, 2-ethylbutanol, s-heptanol, 3-heptanol, n-octanol, 2-ethylhexanol, s-octanol, n-nonyl alcohol, 2,6-dimethyl-4-heptanol, n-decanol, s-undecyl alcohol, trimethylnonyl alcohol, s-tetradecyl alcohol, s-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents, such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, isopropyl acetate, n-butyl acetate, isobutyl acetate, s-butyl acetate, n-pentyl acetate, s-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more species.

Of these, preferred are ketone solvents, such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone, in view of the preservation stability of the resultant solution.

Bisphenol S or a bisphenol S derivative may be added as a pH adjuster. The amount of bisphenol S or a bisphenol S derivative is 0.01 to 20 parts by mass, or 0.01 to 10 parts by mass, or 0.01 to 5 parts by mass relative to 100 parts by mass of the polyorganosiloxane.

Specific examples of the bisphenol S or the bisphenol S derivative include, but are not limited to, those described below.

Formula (C-1)

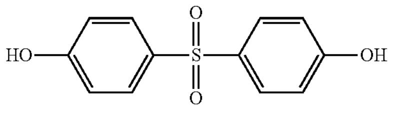

Formula (C-2)

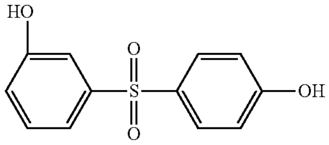

-continued

Formula (C-3)

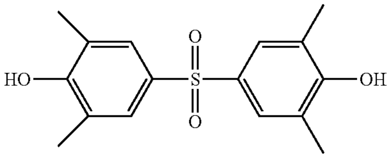

Formula (C-4)

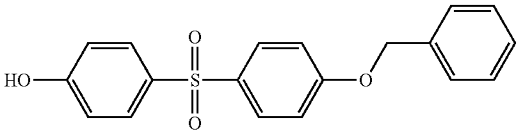

Formula (C-5)

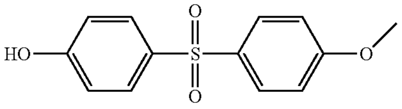

Formula (C-6)

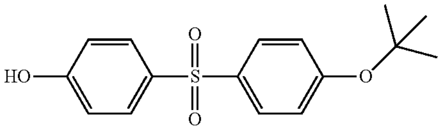

Formula (C-7)

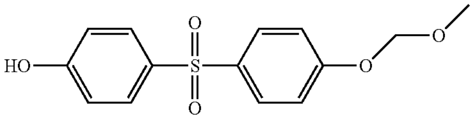

Formula (C-8)

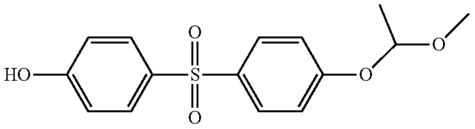

Formula (C-9)

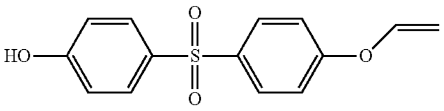

Formula (C-10)

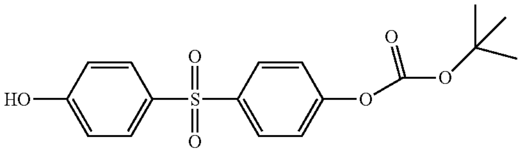

Formula (C-11)

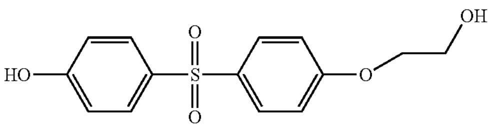

Formula (C-12)

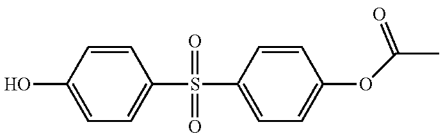

-continued

Formula (C-13)

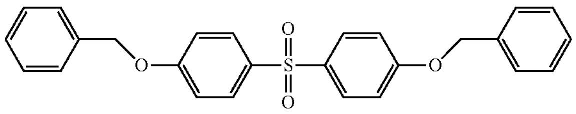

Formula (C-14)

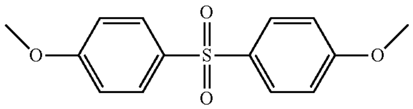

Formula (C-15)

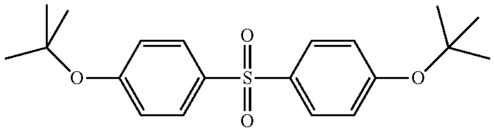

Formula (C-16)

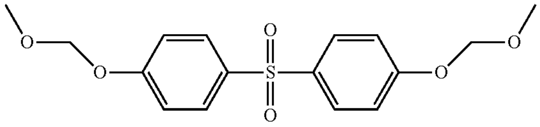

Formula (C-17)

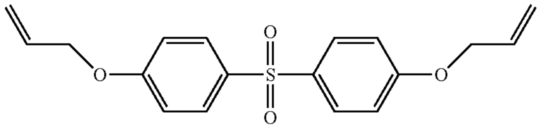

Formula (C-18)

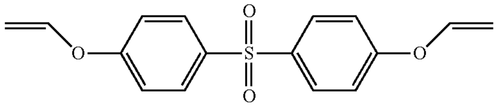

Formula (C-19)

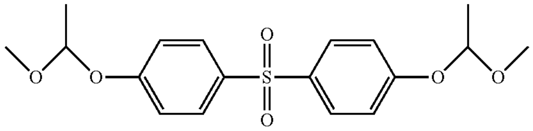

Formula (C-20)

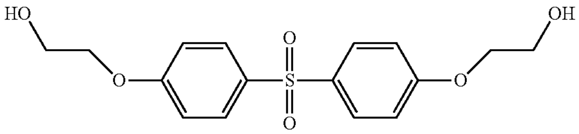

Formula (C-21)

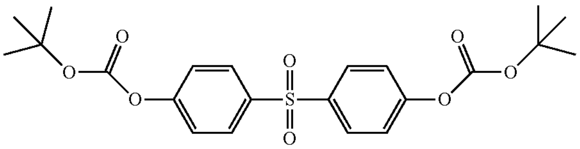

Formula (C-22)

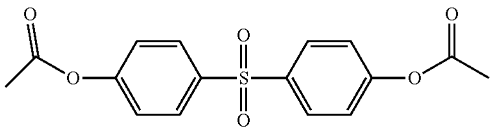

-continued

Formula (C-23)

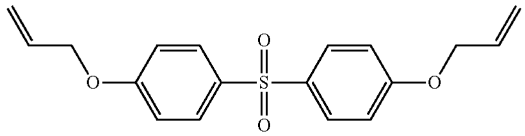

The reaction temperature of hydrolysis or condensation is generally 20 to 100° C. In a certain embodiment, the reaction temperature is 20 to 80° C.

When a silane other than the hetero-ring-containing silane of Formula (1) is used as a hydrolyzable silane, the amount of the hetero-ring-containing silane of Formula (1) added is generally 0.1% by mole or more in all the hydrolyzable silanes. From the viewpoint of achieving the aforementioned effects of the present invention with high reproducibility, the amount of the hetero-ring-containing silane of Formula (1) is preferably 0.5% by mole or more, more preferably 1% by mole or more, still more preferably 5% by mole or more.

When the additional silane of Formula (2) or the additional silane of Formula (3) is used as a hydrolyzable silane, the amount of the additional silane added is generally 0.1% by mole or more, preferably 1% by mole or more, more preferably 5% by mole or more, in all the hydrolyzable silanes. The amount of the additional silane is generally 99.9% by mole or less, preferably 99% by mole or less, more preferably 95% by mole or less.

When the hydrolyzable organosilane of Formula (4) is used as a hydrolyzable silane, the amount of the organosilane added is generally 0.01% by mole or more, preferably 0.1% by mole or more, in all the hydrolyzable silanes. The amount of the organosilane is generally 30% by mole or less, preferably 10% by mole or less.

The hydrolysis of the hydrolyzable silane under the above-described conditions can produce a hydrolysate or a hydrolysis condensate.

After completion of the reaction, the reaction solution is used as is, or diluted or concentrated. The resultant reaction solution can be neutralized or treated with an ion-exchange resin, to thereby remove the acid or base catalyst used for the hydrolysis. Before or after such a treatment, alcohols (i.e., by-products), water, the catalyst, etc. can be removed from the reaction solution through, for example, distillation under reduced pressure.

If necessary, such a purification process can be followed by entire or partial removal of the solvent from the solution containing a hydrolysis condensate, to thereby prepare the hydrolysis condensate in the form of a solid or a solution containing the condensate.

The film-forming composition of the present invention can be produced by mixing of the aforementioned hydrolyzable silane, a hydrolysate of the silane, and/or a hydrolysis condensate of the silane, a solvent, and an additional component (if incorporated). In this case, a solution containing the hydrolysis condensate, etc. may be previously prepared, and the solution may be mixed with a solvent and an additional component.

No particular limitation is imposed on the order of mixing of these components. For example, a solvent may be added to and mixed with a solution containing the hydrolysis condensate, etc., and an additional component may be added to the resultant mixture. Alternatively, a solution containing the hydrolysis condensate, etc., a solvent, and an additional component may be mixed simultaneously.

If necessary, an additional solvent may be finally added, or some components that can be relatively easily dissolved in a solvent may be finally added without being incorporated into the mixture. However, from the viewpoint of preventing aggregation or separation of components to prepare a highly homogeneous composition with high reproducibility, the composition is preferably prepared from a previously prepared solution containing the well-dissolved hydrolysis condensate, etc. It should be noted that the hydrolysis condensate, etc. may be aggregated or precipitated when mixed with a solvent or an additional component, depending on, for example, the type or amount of the solvent or the amount or nature of the component. It should also be noted that when a composition is prepared from a solution containing the hydrolysis condensate, etc., the concentration of the solution of the hydrolysis condensate, etc. or the amount of the solution used must be determined so as to achieve a desired amount of the hydrolysis condensate, etc. contained in the finally produced composition.

During preparation of the composition, the composition may be appropriately heated so long as the components are not decomposed or denatured.

In the present invention, the film-forming composition may be filtered with, for example, a submicrometer-order filter during production of the composition or after mixing of all the components.

The solid content concentration of the film-forming composition of the present invention is generally 0.1 to 50% by mass relative to the mass of the composition. However, the solid content concentration is preferably 30% by mass or less, more preferably 25% by mass or less, from the viewpoint of, for example, preventing precipitation of the solid content.

The total amount of the hydrolyzable silane, the hydrolysate of the silane, and the hydrolysis condensate of the silane in the solid content is generally 50% by mass or more, preferably 60% by mass or more, more preferably 70% by mass or more, still more preferably 80% by mass or more, much more preferably 90% by mass or more, from the viewpoint of achieving the aforementioned effects of the present invention with high reproducibility.

In the present invention, the film-forming composition can be used as a resist underlayer film-forming composition for a lithographic process.

In one embodiment of the present invention, the resist underlayer film-forming composition (composed of the film-forming composition of the present invention) is applied onto a substrate used for the production of a semiconductor device (e.g., a silicon wafer substrate, a silicon/silicon dioxide-coated substrate, a silicon nitride substrate, a glass substrate, an ITO substrate, a polyimide substrate, or a substrate coated with a low dielectric constant material (low-k material)) by an appropriate application method with, for example, a spinner or a coater, followed by baking of the composition, to thereby form the Si-containing resist underlayer film of the present invention.

The baking is generally performed under appropriately determined conditions; i.e., a baking temperature of 80° C. to 250° C. and a baking time of 0.3 to 60 minutes. Preferably, the baking temperature is 150° C. to 250° C., and the baking time is 0.5 to 2 minutes.

The Si-containing resist underlayer film of the present invention has a thickness of, for example, 10 to 1,000 nm, or 20 to 500 nm, or 50 to 300 nm, or 100 to 200 nm.

Subsequently, for example, a photoresist layer is formed on the Si-containing resist underlayer film of the present invention. The photoresist layer can be formed by a well-known process; i.e., application of a photoresist composition onto the Si-containing resist underlayer film of the present invention, and baking of the composition. The thickness of the photoresist is, for example, 50 to 10,000 nm, or 100 to 2,000 nm, or 200 to 1,000 nm.

In another embodiment of the present invention, an organic underlayer film can be formed on a substrate, the Si-containing resist underlayer film of the present invention can then be formed on the organic underlayer film, and then a photoresist layer can be formed on the resist underlayer film. This process can narrow the pattern width of the photoresist. Thus, even when the photoresist is applied thinly for preventing pattern collapse, the substrate can be processed through selection of an appropriate etching gas. For example, the Si-containing resist underlayer film of the present invention can be processed by using, as an etching gas, a fluorine-containing gas that achieves a significantly high etching rate for the photoresist. The organic underlayer film can be processed by using, as an etching gas, an oxygen-containing gas that achieves a significantly high etching rate for the Si-containing resist underlayer film of the present invention. The substrate can be processed by using, as an etching gas, a fluorine-containing gas that achieves a significantly high etching rate for the organic underlayer film.

No particular limitation is imposed on the photoresist formed on the Si-containing resist underlayer film of the present invention, so long as the photoresist is sensitive to light used for exposure. The photoresist may be either of negative and positive photoresists. Specific examples of the photoresist include, but are not limited to, a positive photoresist formed of a novolac resin and a 1,2-naphthoquinone diazide sulfonic acid ester; a chemically amplified photoresist formed of a binder having a group that decomposes with an acid to thereby increase the alkali dissolution rate and a photoacid generator; a chemically amplified photoresist formed of a low-molecular-weight compound that decomposes with an acid to thereby increase the alkali dissolution rate of the photoresist, an alkali-soluble binder, and a photoacid generator; and a chemically amplified photoresist formed of a binder having a group that decomposes with an acid to thereby increase the alkali dissolution rate, a low-molecular-weight compound that decomposes with an acid to thereby increase the alkali dissolution rate of the photoresist, and a photoacid generator.

Specific examples of commercially available products include, but are not limited to, trade name APEX-E, available from Shipley, trade name PAR710, available from Sumitomo Chemical Company, Limited, and trade name SEPR430, available from Shin-Etsu Chemical Co., Ltd.

Also, fluorine atom-containing polymer-based photoresists described, for example, in Proc. SPIE, Vol. 3999, 330-334 (2000), Proc. SPIE, Vol. 3999, 357-364 (2000), and Proc. SPIE, Vol. 3999, 365-374 (2000) can be suitably used.

Subsequently, light exposure is performed through a predetermined mask. The light exposure may involve the use of, for example, a KrF excimer laser (wavelength: 248 nm), an ArF excimer laser (wavelength: 193 nm), and an F2 excimer laser (wavelength: 157 nm).

After the light exposure, post exposure bake may optionally be performed. The post exposure bake is performed under appropriately determined conditions; i.e., a heating temperature of 70° C. to 150° C. and a heating time of 0.3 to 10 minutes.

In the present invention, a resist for electron beam lithography or a resist for EUV lithography may be used instead of the photoresist.

The resist for electron beam lithography may be either of negative and positive resists. Specific examples of the resist for electron beam lithography include, but are not limited to, a chemically amplified resist formed of an acid generator and a binder having a group that decomposes with an acid to thereby change the alkali dissolution rate; a chemically amplified resist formed of an alkali-soluble binder, an acid generator, and a low-molecular-weight compound that decomposes with an acid to thereby change the alkali dissolution rate of the resist; a chemically amplified resist formed of an acid generator, a binder having a group that decomposes with an acid to thereby change the alkali dissolution rate, and a low-molecular-weight compound that decomposes with an acid to thereby change the alkali dissolution rate of the resist; a non-chemically amplified resist formed of a binder having a group that decomposes with electron beams to thereby change the alkali dissolution rate; and a non-chemically amplified resist formed of a binder having a moiety that is cut with electron beams to thereby change the alkali dissolution rate. Also in the case of use of such a resist for electron beam lithography, a resist pattern can be formed by using electron beams as an irradiation source in the same manner as in the case of using the photoresist.

The resist for EUV lithography may be a methacrylate resin-based resist.

Subsequently, development is performed with a developer (e.g., an alkaline developer). When, for example, a positive photoresist is used, an exposed portion of the photoresist is removed to thereby form a pattern of the photoresist.

Specific examples of the developer include, but are not limited to, alkaline aqueous solutions, for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine.

In the present invention, the developer may be an organic solvent. Specifically, the development is performed with a developer (an organic solvent) after the light exposure. When, for example, a positive photoresist is used, an unexposed portion of the photoresist is removed to thereby form a pattern of the photoresist.

Specific examples of the organic solvent that may be used as a developer include, but are not limited to, methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate.

The developer may optionally contain, for example, a surfactant.

The development is performed under appropriately determined conditions; i.e., a temperature of 5 to 50° C. and a time of 10 to 600 seconds.

Thus-formed pattern of the photoresist (upper layer) is used as a protective film for removing the Si-containing resist underlayer film (intermediate layer) of the present invention. Subsequently, the patterned photoresist and Si-containing resist underlayer film (intermediate layer) of the present invention are used as protective films for removing the organic underlayer film (lower layer). Finally, the patterned Si-containing resist underlayer film (intermediate layer) of the present invention and organic underlayer film (lower layer) are used as protective films for processing the semiconductor substrate.

Firstly, a photoresist-removed portion of the Si-containing resist underlayer film (intermediate layer) of the present invention is removed by dry etching to thereby expose the semiconductor substrate.

The dry etching of the Si-containing resist underlayer film of the present invention can be performed with any of gases, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane.

The dry etching of the Si-containing resist underlayer film is preferably performed with a halogen-containing gas. In general, a photoresist formed of an organic substance is hard to be removed by dry etching with a halogen-containing gas. In contrast, the Si-containing resist underlayer film of the present invention, which contains numerous silicon atoms, is quickly removed by dry etching with a halogen-containing gas. Therefore, a reduction in the thickness of the photoresist in association with the dry etching of the Si-containing resist underlayer film can be suppressed. Thus, the photoresist can be used in the form of thin film. The dry etching of the Si-containing resist underlayer film is preferably performed with a fluorine-containing gas. Examples of the fluorine-containing gas include, but are not limited to, tetrafluoromethane ($CF_4$), perfluorocyclobutane ($C_4F_8$), perfluoropropane ($C_3F_8$), trifluoromethane, and difluoromethane ($CH_2F_2$).

Thereafter, the patterned photoresist and Si-containing resist underlayer film of the present invention are used as protective films for removing the organic underlayer film. The dry etching of the organic underlayer film (lower layer) is preferably performed with an oxygen-containing gas, since the Si-containing resist underlayer film of the present invention, which contains numerous silicon atoms, is less likely to be removed by dry etching with an oxygen-containing gas.

Finally, the semiconductor substrate is processed. The processing of the semiconductor substrate is preferably performed by dry etching with a fluorine-containing gas.

Examples of the fluorine-containing gas include, but are not limited to, tetrafluoromethane ($CF_4$), perfluorocyclobutane ($C_4F_8$), perfluoropropane ($C_3F_8$), trifluoromethane, and difluoromethane ($CH_2F_2$).

An organic anti-reflective coating may be formed on the Si-containing resist underlayer film of the present invention before formation of the photoresist. No particular limitation is imposed on the composition used for formation of the anti-reflective coating, and, for example, the composition may be appropriately selected from anti-reflective coating compositions that have been conventionally used in a lithography process. The anti-reflective coating can be formed by a commonly used method, for example, application of the composition with a spinner or a coater, and baking of the composition.

The substrate to which the resist underlayer film-forming composition (composed of the film-forming composition of the present invention) is applied may have an organic or inorganic anti-reflective coating formed thereon by, for example, a CVD process. The Si-containing resist underlayer film of the present invention may be formed on the anti-reflective coating.

The Si-containing resist underlayer film formed from the resist underlayer film-forming composition of the present invention may absorb light used in a lithography process depending on the wavelength of the light. In such a case, the Si-containing resist underlayer film can function as an anti-reflective coating having the effect of preventing reflection of light from the substrate. Furthermore, the Si-containing resist underlayer film of the present invention can be used as, for example, a layer for preventing the interaction between the substrate and the photoresist; a layer having the function of preventing the adverse effect, on the substrate, of a material used for the photoresist or a substance generated during the exposure of the photoresist to light; a layer having the function of preventing diffusion of a substance generated from the substrate during heating and baking to the photoresist serving as an upper layer; and a barrier layer for reducing a poisoning effect of a dielectric layer of the semiconductor substrate on the photoresist layer.

The Si-containing resist underlayer film formed from the resist underlayer film-forming composition of the present invention can be applied to a substrate having via holes for use in a dual damascene process, and can be used as an embedding material to fill up the holes. The resist underlayer film can also be used as a planarization material for planarizing the surface of a semiconductor substrate having irregularities.

The EUV resist underlayer film can function not only as a hard mask, but also be as a resist underlayer film for the purpose described below. Specifically, the resist underlayer film-forming composition can be used for an anti-reflective EUV resist underlayer coating capable of, without intermixing with an EUV resist, preventing the reflection, from a substrate or an interface, of exposure light undesirable for EUV exposure; for example, the aforementioned deep ultraviolet (DUV) light. Thus, the reflection can be efficiently prevented in the underlayer of the EUV resist. When the resist underlayer film is used as an EUV resist underlayer film, the film can be processed in the same manner as in the photoresist underlayer film.

EXAMPLES

The present invention will next be described in more detail with reference to Synthesis Examples and Examples, but the present invention should not be construed as being limited to the following Examples.

The purities described below were measured by gas chromatography (GC). The GC measurement was performed with a GC apparatus (GC-2010 PLUS Series) available from Shimadzu Corporation under the following measurement conditions.

Column: DB-1, 0.25 μm, 30 m×0.250 mm (Agilent Technologies)

Carrier gas: He 32.0 cm/sec (117.5 kPa)*) linear velocity control

Column temperature: 100° C. (retained for 15 minutes)→temperature increase (15° C./min)→250° C. (retained for 5 minutes)→temperature increase (15° C./min)→300° C. (retained for 5 minutes).

Injector: Split (30), 250° C.

Detector: FID (300° C.)

Analysis time: 38.3 min

Injection volume: 1.0 μL

Dilution solvent: acetonitrile

Sample concentration: 1.0 wt % (filtration of impurities with filter PTFE, 0.45 μm)

[1] Synthesis of Silane Compound

Synthesis Example 1-1

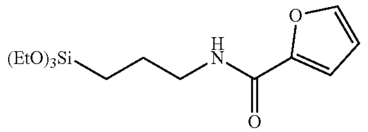

(1-5-3E)

A 300-mL flask equipped with a thermometer and a stirrer was charged with 15.0 g (0.0651 mol) of 3-aminopropyltriethoxysilane (available from Tokyo Chemical Industry Co., Ltd.), 7.99 g (0.0781 mol) of triethylamine (available from Tokyo Chemical Industry Co., Ltd.), and 90.0 g (6 parts) of toluene (available from KANTO CHEMICAL CO., INC.), and the resultant mixture was cooled to 5° C. Subsequently, 8.65 g (0.0651 mol) of 2-furoyl chloride (available from Tokyo Chemical Industry Co., Ltd.) and 30.0 g (2 parts) of toluene (available from KANTO CHEMICAL CO., INC.) were added, and then the resultant mixture was heated to 23° C. and stirred for one hour.

Thereafter, the solvent was distilled off from the reaction solution under reduced pressure at 40° C., and the resultant concentrate was mixed with 150 g (10 parts) of ethyl acetate (available from KANTO CHEMICAL CO., INC.) and 150 g (10 parts) of pure water. The mixture was subjected to phase-separation treatment, to thereby recover the organic phase and to remove the aqueous phase. The recovered organic phase was then mixed with 150 g (10 parts) of pure water, and the mixture was subjected to phase-separation treatment. Thus, the operation including recovery of the organic phase and removal of the aqueous phase was performed twice. Subsequently, 60.1 g of sodium sulfate (available from KANTO CHEMICAL CO., INC.) was added to the resultant organic phase for removal of water. The resultant product was then subjected to filtration, and the filtrate was recovered.

The solvent was distilled off from the recovered filtrate under reduced pressure at 40° C., to thereby produce 17.0 g of N-(3-(triethoxysilyl)propyl)furan-2-carboxyamide of Formula (1-5-3E) as a white solid (yield: 82.7%, purity: 99.1%).

The resultant N-(3-(triethoxysilyl)propyl)furan-2-carboxyamide was found to exhibit the following δ values as measured by $^{1}$H-NMR spectrum (DMSO-d6).

8.34 (s, 1H), 7.80 (d, 1H), 7.06 (d, 1H), 6.60 (d, 1H), 3.74 (q, 6H), 3.17 (t, 2H), 1.54 (d, 2H), 1.14 (t, 9H), 0.56 (t, 2H)

Synthesis Example 1-2

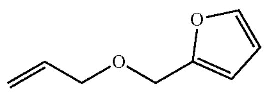

(Z1)

A 500-mL flask equipped with a thermometer and a stirrer was charged with 14.4 g (0.330 mol) of sodium hydride (available from KANTO CHEMICAL CO., INC.) and 180 g (6 parts) of tetrahydrofuran (dehydrated) (available from KANTO CHEMICAL CO., INC.), and the resultant mixture was cooled to 5° C. Subsequently, a solution of 30.1 g (0.300 mol) of furfuryl alcohol (available from Tokyo Chemical Industry Co., Ltd.) in 90.0 g (3 parts) of tetrahydrofuran (dehydrated) (available from KANTO CHEMICAL CO., INC.) was added, and then the resultant mixture was heated to 23° C. and stirred for four hours.

Thereafter, the reaction solution in the flask was mixed with 300 g (10 parts) of ethyl acetate (available from KANTO CHEMICAL CO., INC.) and 300 g (10 parts) of pure water, and the mixture was subjected to phase-separation treatment, to thereby recover the organic phase and to remove the aqueous phase. The recovered organic phase was then mixed with 300 g (10 parts) of pure water, and the mixture was subjected to phase-separation treatment. Thus, the operation including recovery of the organic phase and removal of the aqueous phase was performed twice.

Finally, the solvent was distilled off from the resultant organic phase under reduced pressure at 30° C., to thereby produce 32.7 g of 2-((allyloxy)methyl)furan of Formula (Z1) as a colorless oil (yield: 79.0%, purity: 97.8%).

The resultant 2-((allyloxy)methyl)furan was found to exhibit the following δ values as measured by $^{1}$H-NMR spectrum (DMSO-d6).

7.64 (d, 1H), 6.42 (m, 2H), 5.88 (td, 1H), 5.25 (d, 1H), 5.15 (d, 1H), 4.40 (s, 2H), 3.94 (d, 2H)

Synthesis Example 1-3

(1-3-6E)

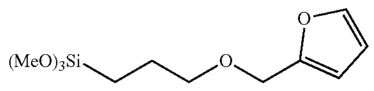

A 500-mL flask equipped with a thermometer and a stirrer was charged with 29.9 g (0.2128 mol) of 2-((allyloxy)methyl)furan, 150 g (5 parts) of toluene (available from KANTO CHEMICAL CO., INC.), and 8.13 g (corresponding to 0.000426 mol of complex) of platinum(0)-1,3-divinyl-1,1,3,3-tetramethyldisiloxane complex solution (available from Sigma-Aldrich Co.). Subsequently, 33.6 g (0.234 mol) of trimethoxysilane (available from Tokyo Chemical Industry Co., Ltd.) was added, and then the resultant mixture was stirred at room temperature for two hours.

Thereafter, the solvent was distilled off from the reaction solution under reduced pressure at 40° C., and the target product was separated through distillation from the resultant concentrate, to thereby produce 11.2 g of (3-(furan-2-ylmethoxy)propyl)trimethoxysilane of Formula (1-3-6E) as a colorless oil (yield: 20.1%, purity: 94.2%).

The resultant (3-(furan-2-ylmethoxy)propyl)trimethoxysilane was found to exhibit the following δ values as measured by $^{1}$H-NMR spectrum (DMSO-d6).

7.62 (d, 1H), 6.42 (d, 1H), 6.39 (d, 1H), 4.37 (d, 2H), 3.45 (s, 9H), 3.34 (t, 2H), 1.53 (tt, 2H), 0.57 (t, 2H)

Synthesis Example 1-4

(Z2)

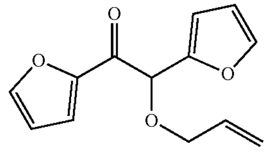

A 500-mL flask equipped with a thermometer and a stirrer was charged with 7.23 g (0.168 mol) of sodium hydride (available from KANTO CHEMICAL CO., INC.) and 180 g (6 parts) of tetrahydrofuran (dehydrated) (available from KANTO CHEMICAL CO., INC.), and the resultant mixture was cooled to 5° C. Subsequently, a solution of 30.0 g (0.153 mol) of furoin (available from Tokyo Chemical Industry Co., Ltd.) in 90.0 g (3 parts) of tetrahydrofuran (dehydrated) (available from KANTO CHEMICAL CO., INC.) was added, and then the resultant mixture was heated to 23° C. and stirred for five hours.

Thereafter, the reaction solution was mixed with 300 g (10 parts) of ethyl acetate (available from KANTO CHEMICAL CO., INC.) and 300 g (10 parts) of pure water, and the mixture was subjected to phase-separation treatment, to thereby recover the organic phase and to remove the aqueous phase. The recovered organic phase was then mixed with 300 g (10 parts) of pure water, and the mixture was subjected to phase-separation treatment. Thus, the operation including recovery of the organic phase and removal of the aqueous phase was performed twice.

The solvent was distilled off from the resultant organic phase under reduced pressure at 30° C., to thereby produce 36.4 g of 2-(allyloxy)-1,2-di(furan-2-yl)ethan-1-one of Formula (Z2) as a colorless oil (yield: 99.0%, purity: 91.1%).

The resultant 2-(allyloxy)-1,2-di(furan-2-yl)ethan-1-one was found to exhibit the following δ values as measured by $^{1}$H-NMR spectrum (DMSO-d6).

7.95 (d, 1H), 7.57 (d, 1H), 7.44 (d, 1H), 6.64 (dd, 1H), 6.50 (d, 1H), 6.42 (d, 1H), 6.29 (s, 1H), 5.71 (dd, 1H), 5.00 (m, 2H), 2.92 (m, 2H)

Synthesis Example 1-5

(1-19-1M)

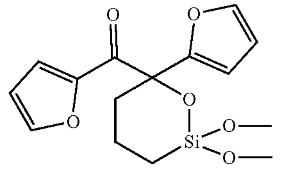

A 500-mL flask equipped with a thermometer and a stirrer was charged with 35.0 g (0.136 mol) of 2-(allyloxy)-1,2-di(furan-2-yl)ethan-1-one, 175 g (5 parts) of toluene (available from KANTO CHEMICAL CO., INC.), and 5.17 g (corresponding to 0.000271 mol of complex) of platinum(0)-1,3-divinyl-1,1,3,3-tetramethyldisiloxane complex solution (available from Sigma-Aldrich Co.). Subsequently, 21.4 g (0.149 mol) of trimethoxysilane (available from Tokyo Chemical Industry Co., Ltd.) was added, and then the resultant mixture was stirred for 24 hours.

Thereafter, the solvent was distilled off from the reaction solution under reduced pressure at 40° C., and the target product was separated through distillation from the resultant concentrate, to thereby produce 11.1 g of furan-2-yl(6-(furan-2-yl)-2,2-dimethoxy-1,2-oxasilan-6-yl)methanone of Formula (1-19-1M) as a colorless oil (yield: 33.3%, purity: 94.6%).

The resultant furan-2-yl(6-(furan-2-yl)-2,2-dimethoxy-1,2-oxasilan-6-yl)methanone was found to exhibit the following δ values as measured by $^{1}$H-NMR spectrum (DMSO-d6).

7.95 (s, 1H), 7.58 (s, 1H), 7.43 (d, 1H), 6.64 (d, 1H), 6.54 (d, 1H), 6.43 (d, 1H), 3.42 (s, 6H), 2.19 (t, 2H), 1.65 (tt, 2H), 0.699 (t, 2H)

[2] Synthesis of Polymer

Synthesis Example 2-1

A 300-mL flask was charged with 21.1 g of tetraethoxysilane, 5.2 g of methyltriethoxysilane, 3.3 g of triethoxy(furan-3-yl)silane, and 44.4 g of acetone. While the resultant mixed solution was stirred with a magnetic stirrer, 26.1 g of 0.01 M aqueous nitric acid solution was added dropwise to the flask.

After completion of the dropwise addition, the flask was transferred to an oil bath set at 85° C., and the mixture was refluxed for 240 minutes. Thereafter, 60 g of propylene glycol monoethyl ether was added to the mixture, and then acetone, methanol, ethanol, and water were distilled off under reduced pressure, followed by concentration, to thereby prepare a solution of a hydrolysis condensate (polymer).

Subsequently, propylene glycol monoethyl ether was added to the solution so as to achieve a solvent proportion of propylene glycol monoethyl ether of 100% and a solid residue content of 13% by weight at 140° C.

The resultant polymer (corresponding to Formula (E1)) was found to have a weight average molecular weight Mw of 1,800 as determined by GPC in terms of polystyrene.

(E1)

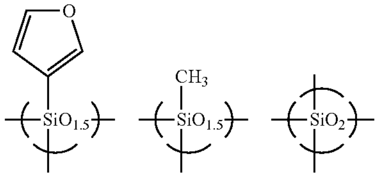

Synthesis Example 2-2

A 300-mL flask was charged with 20.3 g of tetraethoxysilane, 9.6 g of triethoxy(furan-3-yl)silane, and 44.9 g of acetone. While the resultant mixed solution was stirred with a magnetic stirrer, 25.1 g of 0.01 M aqueous nitric acid solution was added dropwise to the flask.

After completion of the dropwise addition, the flask was transferred to an oil bath set at 85° C., and the mixture was refluxed for 240 minutes. Thereafter, 60 g of propylene glycol monoethyl ether was added to the mixture, and then acetone, methanol, ethanol, and water were distilled off under reduced pressure, followed by concentration, to thereby prepare a solution of a hydrolysis condensate (polymer).

Subsequently, propylene glycol monoethyl ether was added to the solution so as to achieve a solvent proportion of propylene glycol monoethyl ether of 100% and a solid residue content of 13% by weight at 140° C.

The resultant polymer (corresponding to Formula (E2)) was found to have a weight average molecular weight Mw of 1,600 as determined by GPC in terms of polystyrene.

(E2)

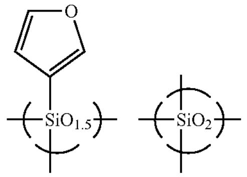

Synthesis Example 2-3

A 300-mL flask was charged with 22.9 g of tetraethoxysilane, 5.3 g of methyltriethoxysilane, 3.6 g of triethoxy(furan-3-yl)silane, and 48.2 g of acetone. While the resultant mixed solution was stirred with a magnetic stirrer, a mixed solution of 19.6 g of 0.2 M aqueous nitric acid solution and 0.33 g of dimethylaminopropyltrimethoxysilane was added dropwise to the flask.

After completion of the dropwise addition, the flask was transferred to an oil bath set at 85° C., and the mixture was refluxed for 240 minutes. Thereafter, 64 g of propylene glycol monoethyl ether was added to the mixture, and then acetone, methanol, ethanol, and water were distilled off under reduced pressure, followed by concentration, to thereby prepare a solution of a hydrolysis condensate (polymer). Subsequently, propylene glycol monoethyl ether was added to the solution so as to achieve a solvent proportion of propylene glycol monoethyl ether of 100% and a solid residue content of 13% by weight at 140° C.

The resultant polymer (corresponding to Formula (E3)) was found to have a weight average molecular weight Mw of 2,200 as determined by GPC in terms of polystyrene.

(E3)

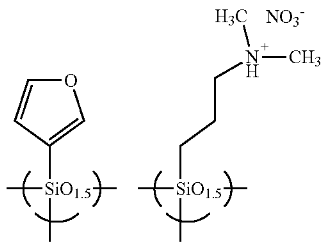

-continued

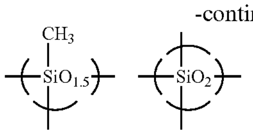

Synthesis Example 2-4

A 300-mL flask was charged with 20.5 g of tetraethoxysilane, 5.0 g of methyltriethoxysilane, 4.4 g of N-(3-triethoxysilyl)propyl)furan-2-carboxamide, and 44.8 g of acetone. While the resultant mixed solution was stirred with a magnetic stirrer, 25.3 g of 0.01 M aqueous nitric acid solution was added dropwise to the flask.

After completion of the dropwise addition, the flask was transferred to an oil bath set at 85° C., and the mixture was refluxed for 240 minutes. Thereafter, 60 g of propylene glycol monoethyl ether was added to the mixture, and then acetone, methanol, ethanol, and water were distilled off under reduced pressure, followed by concentration, to thereby prepare a solution of a hydrolysis condensate (polymer).

Subsequently, propylene glycol monoethyl ether was added to the solution so as to achieve a solvent proportion of propylene glycol monoethyl ether of 100% and a solid residue content of 13% by weight at 140° C.

The resultant polymer (corresponding to Formula (E4)) was found to have a weight average molecular weight Mw of 2,000 as determined by GPC in terms of polystyrene.

(E4)

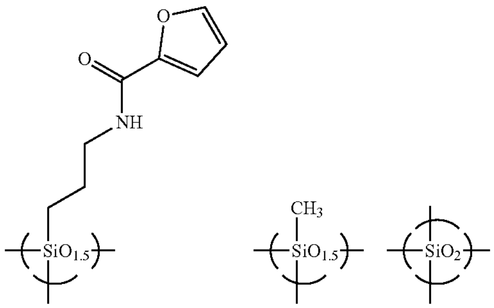

Synthesis Example 2-5

A 300-mL flask was charged with 20.9 g of tetraethoxysilane, 5.1 g of methyltriethoxysilane, 3.7 g of (3-(furan-2-ylmethoxy)propyl)trimethoxysilane, and 44.5 g of acetone. While the resultant mixed solution was stirred with a magnetic stirrer, 25.8 g of 0.01 M aqueous nitric acid solution was added dropwise to the flask.

After completion of the dropwise addition, the flask was transferred to an oil bath set at 85° C., and the mixture was refluxed for 240 minutes. Thereafter, 60 g of propylene glycol monoethyl ether was added to the mixture, and then acetone, methanol, ethanol, and water were distilled off under reduced pressure, followed by concentration, to thereby prepare a solution of a hydrolysis condensate (polymer).

Subsequently, propylene glycol monoethyl ether was added to the solution so as to achieve a solvent proportion of propylene glycol monoethyl ether of 100% and a solid residue content of 13% by weight at 140° C.

The resultant polymer (corresponding to Formula (E5)) was found to have a weight average molecular weight Mw of 2,100 as determined by GPC in terms of polystyrene.

(E5)

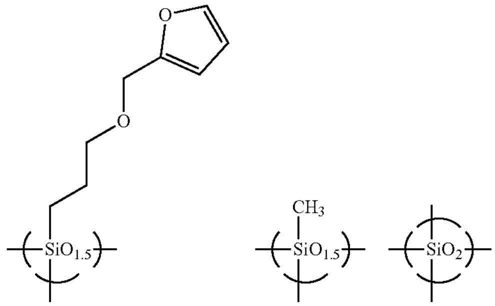

Synthesis Example 2-6

A 300-mL flask was charged with 20.5 g of tetraethoxysilane, 5.0 g of methyltriethoxysilane, 4.4 g of furan-2-yl (6-(furan-2-yl)-2,2-dimethoxy-1,2-oxasilan-6-yl)methanone, and 44.8 g of acetone. While the resultant mixed solution was stirred with a magnetic stirrer, 25.3 g of 0.01 M aqueous nitric acid solution was added dropwise to the flask.

After completion of the dropwise addition, the flask was transferred to an oil bath set at 85° C., and the mixture was refluxed for 240 minutes. Thereafter, 60 g of propylene glycol monoethyl ether was added to the mixture, and then acetone, methanol, ethanol, and water were distilled off under reduced pressure, followed by concentration, to thereby prepare a solution of a hydrolysis condensate (polymer).

Subsequently, propylene glycol monoethyl ether was added to the solution so as to achieve a solvent proportion of propylene glycol monoethyl ether of 100% and a solid residue content of 13% by weight at 140° C.

The resultant polymer (corresponding to Formula (E6)) was found to have a weight average molecular weight Mw of 2,000 as determined by GPC in terms of polystyrene.

(E6)

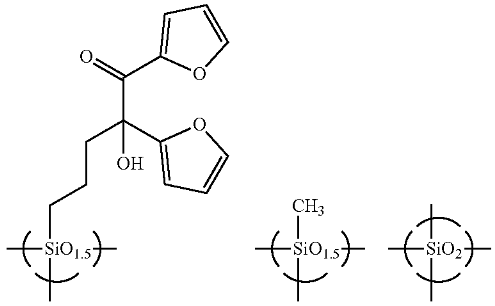

Synthesis Example 2-7

A 300-mL flask was charged with 21.0 g of tetraethoxysilane, 3.5 g of triethoxy(thiophen-2-yl)silane, and 44.5 g of acetone. While the resultant mixed solution was stirred with a magnetic stirrer, 25.9 g of 0.01 M aqueous nitric acid solution was added dropwise to the flask.

After completion of the dropwise addition, the flask was transferred to an oil bath set at 85° C., and the mixture was refluxed for 240 minutes. Thereafter, 60 g of propylene glycol monoethyl ether was added to the mixture, and then acetone, methanol, ethanol, and water were distilled off under reduced pressure, followed by concentration, to thereby prepare a solution of a hydrolysis condensate (polymer).

Subsequently, propylene glycol monoethyl ether was added to the solution so as to achieve a solvent proportion of propylene glycol monoethyl ether of 100% and a solid residue content of 13% by weight at 140° C.

The resultant polymer (corresponding to Formula (E7)) was found to have a weight average molecular weight Mw of 1,900 as determined by GPC in terms of polystyrene.

(E7)

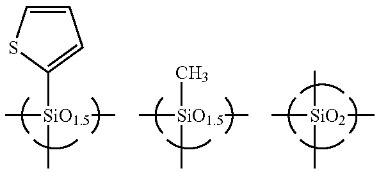

Synthesis Example 2-8

A 300-mL flask was charged with 20.7 g of tetraethoxysilane, 5.1 g of methyltriethoxysilane, 4.0 g of trimethoxy(3-(thiophen-2-ylthio)propyl)silane, and 44.6 g of acetone. While the resultant mixed solution was stirred with a magnetic stirrer, 25.6 g of 0.01 M aqueous nitric acid solution was added dropwise to the flask.

After completion of the dropwise addition, the flask was transferred to an oil bath set at 85° C., and the mixture was refluxed for 240 minutes. Thereafter, 60 g of propylene glycol monoethyl ether was added to the mixture, and then acetone, methanol, ethanol, and water were distilled off under reduced pressure, followed by concentration, to thereby prepare a solution of a hydrolysis condensate (polymer).

Subsequently, propylene glycol monoethyl ether was added to the solution so as to achieve a solvent proportion of propylene glycol monoethyl ether of 100% and a solid residue content of 13% by weight at 140° C.

The resultant polymer (corresponding to Formula (E8)) was found to have a weight average molecular weight Mw of 2,300 as determined by GPC in terms of polystyrene.

(E8)

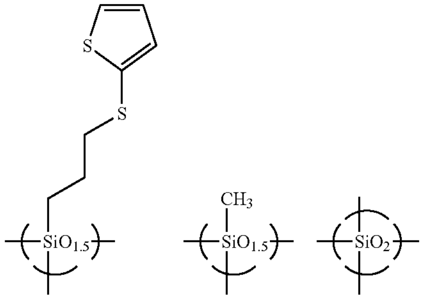

Comparative Synthesis Example 1

A 300-mL flask was charged with 24.1 g of tetraethoxysilane, 1.8 g of phenyltrimethoxysilane, 9.5 g of triethoxymethylsilane, and 53.0 g of acetone. While the resultant mixed solution was stirred with a magnetic stirrer, 11.7 g of 0.01 M aqueous hydrochloric acid solution was added dropwise to the mixed solution.

After completion of the dropwise addition, the flask was transferred to an oil bath set at 85° C., and the mixture was refluxed for 240 minutes. Thereafter, 70 g of propylene glycol monomethyl ether was added to the mixture, and then acetone, methanol, ethanol, and water were distilled off under reduced pressure, followed by concentration, to thereby prepare a solution of a hydrolysis condensate (polymer). Subsequently, propylene glycol monomethyl ether was added to the solution so as to achieve a solid residue content of 13% by weight at 140° C.

The resultant polymer (corresponding to Formula (C1)) was found to have a weight average molecular weight Mw of 1,400 as determined by GPC in terms of polystyrene.

(C1)

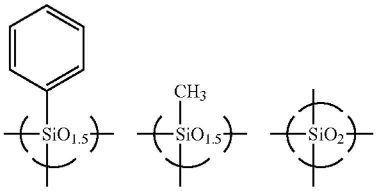

[3] Preparation of Composition to be Applied to Resist Pattern

Each of the polysiloxanes (polymers) prepared in Synthesis Examples 2-1 to 2-8 and Comparative Synthesis Example 1, an acid, and a solvent were mixed in proportions shown in Table 1, and the resultant mixture was filtered with a fluororesin-made filter (0.1 μm), to thereby prepare a composition to be applied to a resist pattern.

The amount of each polymer shown in Table 1 corresponds not to the amount of the polymer solution, but to the amount of the polymer itself. In Table 1, PGEE denotes propylene glycol monoethyl ether; PGMEA, propylene glycol monomethyl ether acetate; PGME, propylene glycol monomethyl ether; DIW, ultrapure water; MA, maleic acid; TPSNO3, triphenylsulfonium nitrate; TPSML, triphenylsulfonium maleate; TPSTFA, triphenylsulfonium trifluoroacetate; TPSCl, triphenylsulfonium hydrochloride; and TPSAc, triphenylsulfonium acetate.

TABLE 1

| | Polymer | Additive 1 | Additive 2 | Solvent | | | |
|---|---|---|---|---|---|---|---|
| Example 1 | Synthesis Example 2-1 | MA | TPSNO3 | PGEE | PGMEA | PGME | DIW |
| (part(s) by mass) | 1 | 0.03 | 0.05 | 70 | 10 | 8 | 12 |
| Example 2 | Synthesis Example 2-2 | MA | TPSML | PGEE | PGMEA | PGME | DIW |
| (part(s) by mass) | 1 | 0.03 | 0.05 | 70 | 10 | 8 | 12 |
| Example 3 | Synthesis Example 2-3 | MA | — | PGEE | PGMEA | PGME | DIW |
| (part(s) by mass) | 1 | 0.03 | — | 70 | 10 | 8 | 12 |
| Example 4 | Synthesis Example 2-4 | MA | TPSCl | PGEE | PGMEA | PGME | DIW |
| (part(s) by mass) | 1 | 0.03 | 0.05 | 70 | 10 | 8 | 12 |
| Example 5 | Synthesis Example 2-5 | MA | TPSTFA | PGEE | PGMEA | PGME | DIW |
| (part(s) by mass) | 1 | 0.03 | 0.05 | 70 | 10 | 8 | 12 |
| Example 6 | Synthesis Example 2-6 | MA | TPSAc | PGEE | PGMEA | PGME | DIW |
| (part(s) by mass) | 1 | 0.03 | 0.05 | 70 | 10 | 8 | 12 |
| Example 7 | Synthesis Example 2-7 | MA | TPSNO3 | PGEE | PGMEA | PGME | DIW |
| (part(s) by mass) | 1 | 0.03 | 0.15 | 70 | 10 | 8 | 12 |
| Example 8 | Synthesis Example 2-8 | MA | TPSTFA | PGEE | PGMEA | PGME | DIW |
| (part(s) by mass) | 1 | 0.03 | 0.15 | 70 | 10 | 8 | 12 |
| Comparative Example 1 | Comparative Synthesis Example 1 | MA | — | PGEE | PGMEA | PGME | DIW |
| (part(s) by mass) | 1 | 0.03 | — | 70 | 10 | 8 | 12 |
| Comparative Example 2 | Comparative Synthesis Example 1 | MA | TPSNO3 | PGEE | PGMEA | PGME | DIW |
| (part(s) by mass) | 1 | 0.03 | 0.05 | 70 | 10 | 8 | 12 |

[4] Preparation of Organic Underlayer Film-Forming Composition

In a nitrogen atmosphere, a 100-mL four-necked flask was charged with 6.69 g (0.040 mol) of carbazole (available from Tokyo Chemical Industry Co., Ltd.), 7.28 g (0.040 mol) of 9-fluorenone (available from Tokyo Chemical Industry Co., Ltd.), and 0.76 g (0.0040 mol) of p-toluenesulfonic acid monohydrate (available from Tokyo Chemical Industry Co., Ltd.), and then 6.69 g of 1,4-dioxane (available from KANTO CHEMICAL CO., INC.) was added to the flask. The resultant mixture was stirred and heated to 100° C. for dissolution of the solid, to thereby initiate polymerization. After the elapse of 24 hours, the reaction mixture was left to cool to 60° C.

The cooled reaction mixture was then diluted with 34 g of chloroform (available from KANTO CHEMICAL CO., INC.), and the diluted mixture was added dropwise to 168 g of methanol (available from KANTO CHEMICAL CO., INC.).

The resultant precipitate was filtered, and the filtrate was dried at 80° C. for 24 hours, to thereby yield 9.37 g of a target polymer of Formula (3-1) (hereinafter abbreviated as "PCzFL").

The results of $^1$H-NMR analysis of PCzFL were as follows:

$^1$H-NMR (400 MHz, DMSO-$d_6$): δ7.03-7.55 (br, 12H), δ7.61-8.10 (br, 4H), 811.18 (br, 1H).

PCzFL was found to have a weight average molecular weight Mw of 2,800 as determined by GPC in terms of polystyrene and a polydispersity Mw/Mn of 1.77.

(3-1)

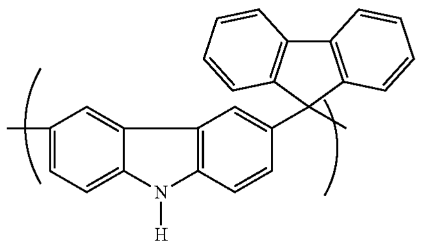

Subsequently, 20 g of PCzFL was mixed with 3.0 g of tetramethoxymethyl glycoluril (trade name: Powderlink 1174, available from Mitsui Cytec Ltd.) serving as a cross-linking agent, 0.30 g of pyridinium p-toluenesulfonate serving as a catalyst, and 0.06 g of MEGAFAC R-30 (trade name, available from Dainippon Ink and Chemicals, Inc.) serving as a surfactant, and the mixture was dissolved in 88 g of propylene glycol monomethyl ether acetate. The resultant solution was filtered with a polyethylene-made microfilter (pore size: 0.10 μm), and then filtered with a polyethylene-made microfilter (pore size: 0.05 μm), to thereby prepare an organic underlayer film-forming composition used for a lithographic process using a multilayer film.

[5] Solvent Resistance Test and Developer Resistance Test

Each of the compositions prepared in Examples 1 to 8 and Comparative Examples 1 and 2 was applied onto a silicon wafer with a spinner, and then heated on a hot plate at 215° C. for one minute, to thereby form an Si-containing resist underlayer film (thickness: 20 nm).

Subsequently, a mixed solvent of propylene glycol monomethyl ether/propylene glycol monomethyl ether acetate (7/3 (V/V)) was applied onto the Si-containing resist underlayer film, and then spin-dried for evaluation of a change in film thickness after application of the solvent. The results of evaluation are shown in Table 2. As shown in Table 2, solvent resistance was evaluated as "Good" or "Not good" when a change in film thickness after application of the solvent was less than 1% or 1% or more, respectively, on the basis of the thickness before application of the solvent.

Separately, an alkaline developer (2.38% aqueous TMAH solution) was applied onto an Si-containing resist underlayer film formed in the same manner as described above, and then spin-dried for evaluation of a change in film thickness after application of the developer. Developer resistance was evaluated as "Good" or "Not good" when a change in film thickness after application of the developer was less than 1% or 1% or more, respectively, on the basis of the thickness before application of the developer.

TABLE 2

| | Solvent resistance | Developer resistance |
|---|---|---|
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |
| Example 8 | Good | Good |
| Comparative Example 1 | Not good | Not good |
| Comparative Example 2 | Good | Good |

[6] Measurement of Dry Etching Rate

The following etchers and etching gases were used for measurement of dry etching rate.

Lam2300 (available from Lam Research Co., Ltd.): $CF_4$/$CHF_3$/$N_2$ (fluorine-containing gas)

RIE-10NR (available from SAMCO Inc.): 02 (oxygen-containing gas)

Each of the compositions prepared in Examples 1 to 8 and Comparative Example 2 was applied onto a silicon wafer with a spinner, and then heated on a hot plate at 215° C. for one minute, to thereby form an Si-containing coating film (thickness: 0.02 μm).

The resultant silicon wafer provided with the Si-containing coating film was used for measurement of dry etching rate with $CF_4$/$CHF_3$/$N_2$ gas and 02 gas as etching gases.

In Table 3, the dry etching rate of an Si-containing resist underlayer film with 02 gas was expressed as the ratio relative to the dry etching rate of an organic underlayer film with 02 gas. The organic underlayer film was prepared as follows. Specifically, the organic underlayer film-forming composition was applied onto a silicon wafer with a spinner, and then heated on a hot plate at 215° C. for one minute, to thereby form an organic underlayer film (thickness: 0.20 μm).

TABLE 3

| | Etching rate with fluorine-containing gas (nm/min) | Ratio of dry etching rate of Si-containing resist underlayer film with $O_2$ gas (relative to organic underlayer film) |
|---|---|---|
| Example 1 | 36 | 0.02 |
| Example 2 | 42 | 0.05 |
| Example 3 | 40 | 0.02 |

TABLE 3-continued

| | Etching rate with fluorine-containing gas (nm/min) | Ratio of dry etching rate of Si-containing resist underlayer film with $O_2$ gas (relative to organic underlayer film) |
|---|---|---|
| Example 4 | 38 | 0.03 |
| Example 5 | 37 | 0.03 |
| Example 6 | 36 | 0.03 |
| Example 7 | 40 | 0.02 |
| Example 8 | 40 | 0.03 |
| Comparative Example 2 | 30 | 0.02 |

[7] Formation of Resist Pattern by EUV Exposure: Positive Alkali Development

The aforementioned organic underlayer film-forming composition was applied onto a silicon wafer with a spinner, and then heated on a hot plate at 215° C. for one minute, to thereby form an organic underlayer film having a thickness of 90 nm.

The resist underlayer film-forming composition prepared in Example 1 was applied onto the organic underlayer film by spin coating, and then heated on a hot plate at 215° C. for one minute, to thereby form an Si-containing resist underlayer film (layer B) (20 nm).

An EUV resist solution (methacrylate resin-polyhydroxystyrene resin hybrid resist) was applied onto the resist underlayer film by spin coating, and then heated on a hot plate at 130° C. for one minute, to thereby form an EUV resist layer (layer C). The EUV resist layer was exposed to light with an EUV exposure apparatus (NXE3300B, available from ASML) under the following conditions: NA: 0.33, σ: 0.67/0.90, Dipole.

After the light exposure, PEB was performed, and the resultant product was cooled on a cooling plate to room temperature, followed by development with an alkaline developer (2.38% aqueous TMAH solution) for 60 seconds and rinsing treatment, to thereby form a resist pattern.

Each of the resist underlayer film-forming compositions prepared in Examples 2 to 8 and Comparative Example 2 was used, and a resist pattern was formed through the same procedure as described above.

Each of the above-formed resist patterns was evaluated for formation of a 32 nm pitch and a 16 nm line-and-space by determining the pattern shape through observation of a cross section of the pattern.

In Table 4, "Good" indicates a shape between footing and undercut and a state of no significant residue in a space portion; "Collapse" indicates an unfavorable state of peeling and collapse of the resist pattern; and "Bridge" indicates an unfavorable state of contact between upper portions or lower portions of the resist pattern.

TABLE 4

| | Pattern shape |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Comparative Example 2 | Collapse |

The invention claimed is:

1. A film-forming composition comprising (a) at least one selected from a hydrolyzable silane, a hydrolysate of the hydrolyzable silane, and a hydrolysis condensate of the hydrolyzable silane, wherein:

the hydrolyzable silane contains a hetero-ring-containing silane of the following Formula (1):

$$R^1R^2_aSi(R^3)_{3-a} \quad (1)$$

wherein $R^1$ is an organic group containing a furan ring and/or a thiophene ring, wherein the organic group containing a furan ring and/or a thiophene ring is an organic group of the following Formula (K):

(K)

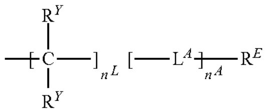

wherein $n^L$ is an integer of 0 to 10;

$n^A$ is an integer of 0 to 5;

$R^Y$ is each independently a hydrogen atom, a methyl group, an ethyl group, a nitro group, a cyano group, a hydroxy group, a thiol group, a furan-ring-containing group, or a thiophene-ring-containing group, and ($n^L$×2) $R^Y$s are optionally identical to or different from one another;

$R^E$ is a hydrogen atom, a methyl group, an ethyl group, a nitro group, a cyano group, a hydroxy group, a thiol group, a furan-ring-containing group, or a thiophene-ring-containing group;

$L^A$ is each independently a divalent group of any of the following Formulae (L1), (L2), (L3), (L4), (L5), (L6a), (L6b), (L7), (L8), (L9a), (L9b), and (L10):

(L1)

(L2)

(L3)

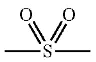

(L4)

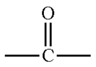

(L5)

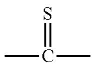

(L6a)

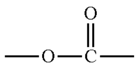

(L6b)

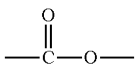

(L7)

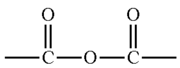

(L8)

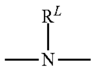

-continued (L9a)

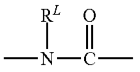

(L9b)

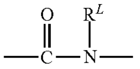

(L10)

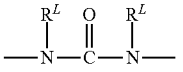

wherein $R^L$ is each independently a hydrogen atom, an alkyl group, or an aryl group;

when $n^L$ is 0, $n^A$ is 0, and $R^E$ is a furan-ring-containing group or a thiophene-ring-containing group; when $n^L$ is 1 or more, at least one of ($n^L$×2) $R^Y$s and $R^E$ is a furan-ring-containing group or a thiophene-ring-containing group; and when a plurality of -$L^A$-groups are present, the -$L^A$- groups are not bonded together; and wherein the thiophene-ring-containing group is selected from the group consisting of (T1)

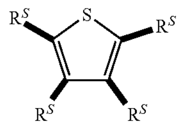

(T2)

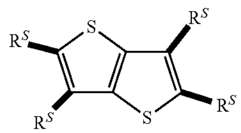

(T3)

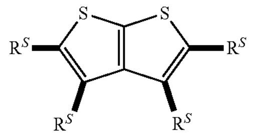

(T4)

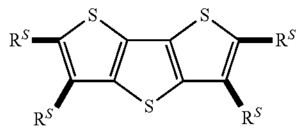

(T5)

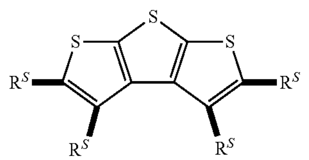

(T6)

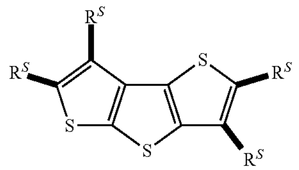

-continued (T7)

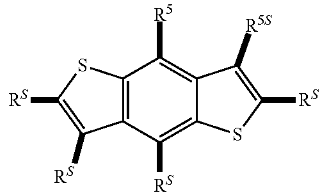

(T8)

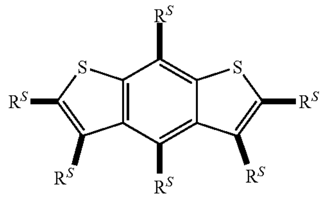

(T9)

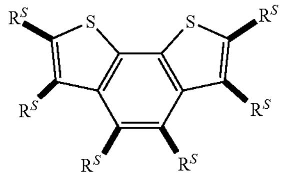

(T10)

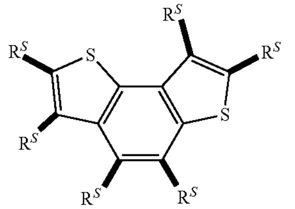

and (T11)

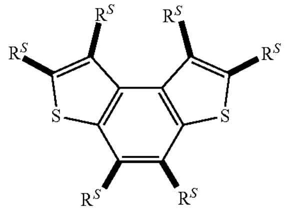

wherein each $R^S$ is independently a single bond, a hydrogen atom, any atom other than a hydrogen atom, or any substituent, with the provisos that (a) one $R^S$ in each Formula is a single bond and is bonded to the silicon atom in Formula (1) directly or via a spacer group, (b) each of the $R^S$ in Formula (T1) are not hydrogen atom simultaneously, and (c) if the composition comprises a hydrolysis condensate of the hydrolyzable silane, the hydrolysis condensate can include a hydrolysis condensate of Formula (E7):

(E7)

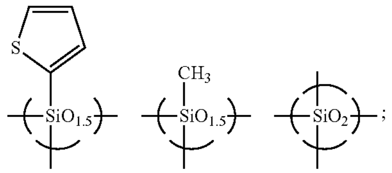

$R^2$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group;

$R^3$ is a group or atom bonded to a silicon atom, and is each independently an alkoxy group, an aralkyloxy group, an acyloxy group, or a halogen atom;

the organic group containing a furan ring and/or a thiophene ring of $R^1$ and the alkoxy group, aralkyloxy group, or acyloxy group of $R^3$ are optionally bonded together to form a ring; and a is an integer of 0 to 2, (b) at least one additional silane selected from the group consisting of the following Formula (2) and the following Formula (3):

$$Si(R^{12})_{4-b} \quad (2)$$

$$[R^{21}{}_cSi(R^{22})_{3-c}]_2Y \quad (3)$$

wherein in Formula (2), $R^{12}$ is a group or atom bonded to a silicon atom, and is each independently an alkoxy group, an aralkyloxy group, an acyloxy group, or a halogen atom; and b is 0; and wherein in Formula (3), $R^{21}$ is a group bonded to a silicon atom, and is each independently an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or an organic group containing an epoxy group, an acryloyl group, a methacryloyl group, a mercapto group, an amino group, or a cyano group;

$R^{22}$ is a group or atom bonded to a silicon atom, and is each independently an alkoxy group, an aralkyloxy group, an acyloxy group, or a halogen atom;

Y is a group bonded to a silicon atom, and is each independently an alkylene group or an arylene group; and c is each independently an integer of 0 to 2, (c) a solvent, and (d) an additive selected from the group consisting of triphenylsulfonium nitrate, triphenylsulfonium trifluoroacetate, triphenylsulfonium hydrochloride, triphenylsulfonium acetate, and combinations thereof.

2. The film-forming composition according to claim 1, wherein the composition comprises a hydrolysis condensate of the hydrolyzable silane.

3. The film-forming composition according to claim 1, wherein the hydrolyzable silane contains the hetero-ring-containing silane of Formula (1) and the additional silane of Formula (2).

4. The film-forming composition according to claim 1, wherein the hydrolyzable silane further contains a hydrolyzable organosilane having an onium group in its molecule.

5. The film-forming composition according to claim 1, wherein the solvent contains water.

6. The film-forming composition according to claim 1, wherein the composition further comprises a pH adjuster.

7. The film-forming composition according to claim 1, wherein the composition is for forming a resist underlayer film.

8. An Si-containing resist underlayer film formed from the film-forming composition according to claim 1.

9. A semiconductor processing substrate comprising a semiconductor substrate and the Si-containing resist underlayer film according to claim 8.

10. A method for producing a semiconductor device, the method comprising:

a step of forming, on a semiconductor substrate, an Si-containing resist underlayer film from the film-forming composition according to claim 1;

a step of forming a resist film on the Si-containing resist underlayer film;

a step of exposing the resist film to light;

a step of developing the resist film after the light exposure, to thereby form a resist pattern;

a step of etching the Si-containing resist underlayer film with the resist pattern; and a step of processing the semiconductor substrate with the patterned resist film and Si-containing resist underlayer film.

11. A method for producing a semiconductor device, the method comprising:

a step of forming an organic underlayer film on a semiconductor substrate;

a step of forming, on the organic underlayer film, an Si-containing resist underlayer film from the film-forming composition according to claim 1;

a step of forming a resist film on the Si-containing resist underlayer film;

a step of exposing the resist film to light;

a step of developing the resist film after the light exposure, to thereby form a resist pattern;

a step of etching the Si-containing resist underlayer film with the resist pattern;

a step of etching the organic underlayer film with the patterned resist film and Si-containing resist underlayer film; and a step of processing the semiconductor substrate with the patterned resist film, Si-containing resist underlayer film, and organic underlayer film.

* * * * *